(12) United States Patent
De Boer et al.

(10) Patent No.: US 9,201,315 B2
(45) Date of Patent: *Dec. 1, 2015

(54) LITHOGRAPHY SYSTEM FOR PROCESSING A TARGET, SUCH AS A WAFER, A METHOD FOR OPERATING A LITHOGRAPHY SYSTEM FOR PROCESSING A TARGET, SUCH AS A WAFER AND A SUBSTRATE FOR USE IN SUCH A LITHOGRAPHY SYSTEM

(75) Inventors: Guido De Boer, Leerdam (NL); Niels Vergeer, Rotterdam (NL); Godefridus Cornelius Antonius Couweleers, Delft (NL); Laurens Plandsoen, Delft (NL); Cor Verburg, Delft (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 800 days.

This patent is subject to a terminal disclaimer.

(21) Appl. No.: 13/453,989

(22) Filed: Apr. 23, 2012

(65) Prior Publication Data

US 2012/0268724 A1    Oct. 25, 2012

Related U.S. Application Data

(60) Provisional application No. 61/478,126, filed on Apr. 22, 2011, provisional application No. 61/491,862, filed on May 31, 2011, provisional application No. 61/486,165, filed on May 13, 2011, provisional (Continued)

(51) Int. Cl.
*G03B 27/68* (2006.01)
*G03B 27/42* (2006.01)
(Continued)

(52) U.S. Cl.
CPC ............ *G03F 9/7088* (2013.01); *G03F 7/7085* (2013.01); *G03F 7/70616* (2013.01); *G03F 7/70666* (2013.01); *G03F 7/70775* (2013.01)

(58) Field of Classification Search
CPC ... G03F 9/7003; G03F 9/7088; G03F 9/7092; G03F 9/7096; G03F 9/7073–9/7084; G03F 7/70775; G03F 7/70758; G03F 7/70825; G03F 7/7085; G03F 7/70858; G03F 7/7095; G03F 7/70958; G03F 7/70616; G03F 7/70666; G03F 7/0683
USPC ........... 355/30, 52, 53, 55, 67–71, 72–75, 77; 250/492.1, 492.2, 492.22, 493.1, 548; 430/5, 8, 22, 30, 311, 312, 321
See application file for complete search history.

(56) References Cited

U.S. PATENT DOCUMENTS

| 3,935,497 A | 1/1976 | Cowles |
| 4,251,160 A | 2/1981 | Bouwhuis et al. |

(Continued)

FOREIGN PATENT DOCUMENTS

| CN | 1495540 | 5/2004 |
| CN | 1577080 | 2/2005 |

(Continued)

OTHER PUBLICATIONS

Reich, C et al. "3-D shape measurement of complex objects by combining photogrammetry and fringe projection", Optical Engineering, Jan. 2000, p. 224-231, vol. 39 No. 1.

(Continued)

*Primary Examiner* — Christina Riddle
(74) *Attorney, Agent, or Firm* — Blakely Sokoloff Taylor & Zafman LLP

(57) ABSTRACT

The invention relates to a lithography system for processing a target, such as a wafer and a substrate for use in such a lithography system. The lithography system comprises a beam source arranged for providing a patterning beam, a final projection system arranged for projecting a pattern on the target surface, a chuck arranged for supporting the target and a mark position system arranged for detecting a position mark on a surface.

29 Claims, 13 Drawing Sheets

Related U.S. Application Data application No. 61/491,867, filed on May 31, 2011, provisional application No. 61/486,167, filed on May 13, 2011, provisional application No. 61/491,866, filed on May 31, 2011.

(51) Int. Cl.
- *G03B 27/52* (2006.01)
- *G03B 27/32* (2006.01)
- *G03F 9/00* (2006.01)
- *G03F 7/20* (2006.01)
- *G03B 27/58* (2006.01)

(56) References Cited

U.S. PATENT DOCUMENTS

| | | | |
|---|---|---|---|
| 4,631,416 A | | 12/1986 | Trutna, Jr. |
| 4,701,606 A | * | 10/1987 | Tanimoto et al. .......... 250/201.4 |
| 4,716,441 A | | 12/1987 | Ogawa |
| 4,967,088 A | | 10/1990 | Stengl et al. |
| 5,243,195 A | | 9/1993 | Nishi |
| 5,477,057 A | * | 12/1995 | Angeley et al. ............... 250/548 |
| 5,557,411 A | | 9/1996 | Houryu et al. |
| 5,594,549 A | | 1/1997 | Mori et al. |
| 5,644,137 A | | 7/1997 | Waggener |
| 5,721,605 A | * | 2/1998 | Mizutani ......................... 355/53 |
| 5,827,629 A | | 10/1998 | Miyatake |
| 5,861,944 A | | 1/1999 | Nishi |
| 5,912,726 A | | 6/1999 | Toguchi et al. |
| 5,929,454 A | | 7/1999 | Muraki et al. |
| 5,943,135 A | | 8/1999 | Mishima |
| 6,459,473 B1 | | 10/2002 | Chang et al. |
| 6,469,793 B1 | * | 10/2002 | Stanton ......................... 356/521 |
| 6,522,411 B1 | | 2/2003 | Moon et al. |
| 6,525,802 B1 | | 2/2003 | Novak |
| 6,583,430 B1 | | 6/2003 | Muraki |
| 6,674,510 B1 | | 1/2004 | Jasper et al. |
| 6,864,493 B2 | | 3/2005 | Sato et al. |
| 7,116,626 B1 | | 10/2006 | Woods et al. |
| 7,177,457 B2 | | 2/2007 | Adel et al. |
| 2002/0020820 A1 | | 2/2002 | Muraki |
| 2002/0043163 A1 | | 4/2002 | Novak |
| 2003/0020184 A1 | | 1/2003 | Ballarin |
| 2004/0059540 A1 | * | 3/2004 | Matsumoto et al. .......... 702/150 |
| 2004/0066518 A1 | * | 4/2004 | Kreuzer ......................... 356/509 |
| 2004/0130690 A1 | | 7/2004 | Koren et al. |
| 2004/0165195 A1 | | 8/2004 | Sato |
| 2005/0002004 A1 | * | 1/2005 | Kolesnychenko et al. ...... 355/30 |
| 2005/0029981 A1 | | 2/2005 | del Puerto |
| 2005/0031969 A1 | | 2/2005 | Finders et al. |
| 2005/0069790 A1 | | 3/2005 | Gruss et al. |
| 2006/0058972 A1 | | 3/2006 | Kok et al. |
| 2006/0103845 A1 | | 5/2006 | Tanaka et al. |
| 2006/0138359 A1 | | 6/2006 | Maeda |
| 2007/0041015 A1 | | 2/2007 | Van Bilsen |
| 2007/0114678 A1 | | 5/2007 | Van Haren et al. |
| 2007/0132996 A1 | | 6/2007 | Van Haren et al. |
| 2007/0234786 A1 | * | 10/2007 | Moon ............................. 73/105 |
| 2007/0247640 A1 | | 10/2007 | Magome et al. |
| 2007/0260419 A1 | | 11/2007 | Hagiwara |
| 2008/0083881 A1 | | 4/2008 | Gorrell et al. |
| 2008/0084547 A1 | | 4/2008 | Tokuday |
| 2008/0240501 A1 | | 10/2008 | Van Der Wijst et al. |
| 2008/0266560 A1 | | 10/2008 | Kok |
| 2008/0291413 A1 | | 11/2008 | Steijaert et al. |
| 2009/0115983 A1 | * | 5/2009 | Stavenga et al. ............... 355/53 |
| 2009/0153861 A1 | | 6/2009 | Musa et al. |
| 2009/0176167 A1 | | 7/2009 | Hulsebos et al. |
| 2009/0237637 A1 | | 9/2009 | Warnaar et al. |
| 2009/0290139 A1 | | 11/2009 | Van Der Sijs |
| 2010/0091259 A1 | | 4/2010 | Koizumi |
| 2010/0245848 A1 | | 9/2010 | Sakamoto |
| 2011/0090476 A1 | | 4/2011 | Van De Kerkhof et al. |
| 2011/0102753 A1 | | 5/2011 | Van De Kerkhof et al. |

FOREIGN PATENT DOCUMENTS

| | | |
|---|---|---|
| CN | 101114135 | 1/2008 |
| CN | 101551593 | 10/2009 |
| EP | 0698826 A | 2/1996 |
| EP | 1061561 | 12/2000 |
| EP | 1076264 A | 2/2001 |
| EP | 1091385 | 4/2001 |
| EP | 1111473 A | 6/2001 |
| EP | 1148390 | 10/2001 |
| EP | 1265271 | 12/2002 |
| EP | 1434103 | 6/2004 |
| EP | 1491966 | 12/2004 |
| EP | 1674937 | 6/2006 |
| EP | 1975981 | 10/2008 |
| JP | H07221166 | 3/1995 |
| JP | H07221166 | 8/1995 |
| WO | 9839689 A | 9/1998 |
| WO | 2005010618 A | 2/2005 |
| WO | 2007032670 A | 3/2007 |
| WO | 2007038134 A | 4/2007 |
| WO | WO-2008037496 | 3/2008 |
| WO | WO-2008126925 | 10/2008 |
| WO | WO-2010032224 | 3/2010 |
| WO | WO-2010087352 | 8/2010 |

OTHER PUBLICATIONS

Buydens, L et al. "Amplitude modulation and beam-steering properties of active binary phase gratings with reconfigurable absorption areas", Applied Optics, Jul. 20, 1994, p. 4792-4800, vol. 33, No. 21.

Lalanne, P et al. "Antireflection behavior of silicon subwavelength periodic structures for visible light", Nanotechnology, 1997, p. 53-56, vol. 8.

Robledo-Sanchez, C et al. "Binary grating with variable bar-space ratio following a geometrical progression", Optics Communications, 1995, p. 465-470, vol. 119.

Davis, J A et al. "Encoding amplitude and phase information onto a binary phase-only spatial light modulator", Applied Optics, Apr. 10, 2003, p. 2003-2008, vol. 42, No. 11.

Davis, J A et al. "Encoding amplitude information onto phase-only filters", Applied Optics, Aug. 10, 1999, p. 5004-5013, vol. 38, No. 23.

Takeda, M et al. "Fourier transform profilometry for the automatic measurement of 3-D object shapes", Applied Optics, Dec. 15, 1983, p. 3977-3982, vol. 22, No. 24.

Print of Internet publication "Improved Overlay for ASML Systems", downloaded on Sep. 1, 2007 from http://www.asml.com/asmldotcom/show.do?ctx=9976&rid=9991.

Collischon, M et al. "Optimized artificial index gratings", Infrared Physics & Technology, 1995, p. 915-921, vol. 36.

Leray, p. et al. "Overlay Metrology for Double Patterning Processes", Proceedings of SPIE, vol. 7272 72720G-1, doi: 10.1117/12.814182.

Fuller, L. "Wafer alignment for Canon Stepper", downloaded from http://people.rit.edu/lffeee/align.pdf, 2008.

Tao, W et al. "Novel fast and accurate correlation-tracking algorithm", Oct. 8, 1996, translation by National Air Intelligence Center NAIC-ID(RS)T-0408-96.

Fuller, L., et al., "Introduction to ASML PAS 5500 Wafer Alignment and Exposure," Nov. 10, 2011, Rochester Institute of Technology Microelectronic Engineering, p. 1-47.

Durnin, J. "Exact Solutions for Nondiffracting Beams I. The Scalar Theory." J. Opt. Soc. Am. A. vol. 4, No. 4. Apr., 1987. pp. 651-654. 4 pages.

Final Office Action in U.S. Appl. No. 13/453,986 dated Jul. 16, 2015. 15 pages.

Non-Final Office Action in U.S. Appl. No. 13/470,234 dated Jun. 30, 2015. 14 pages.

\* cited by examiner

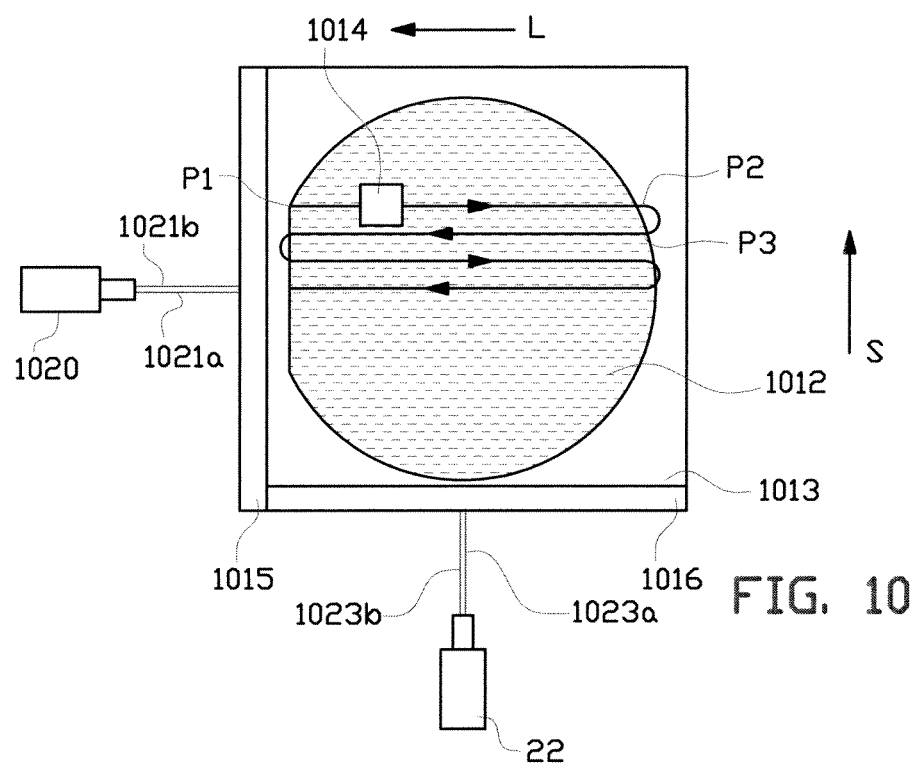

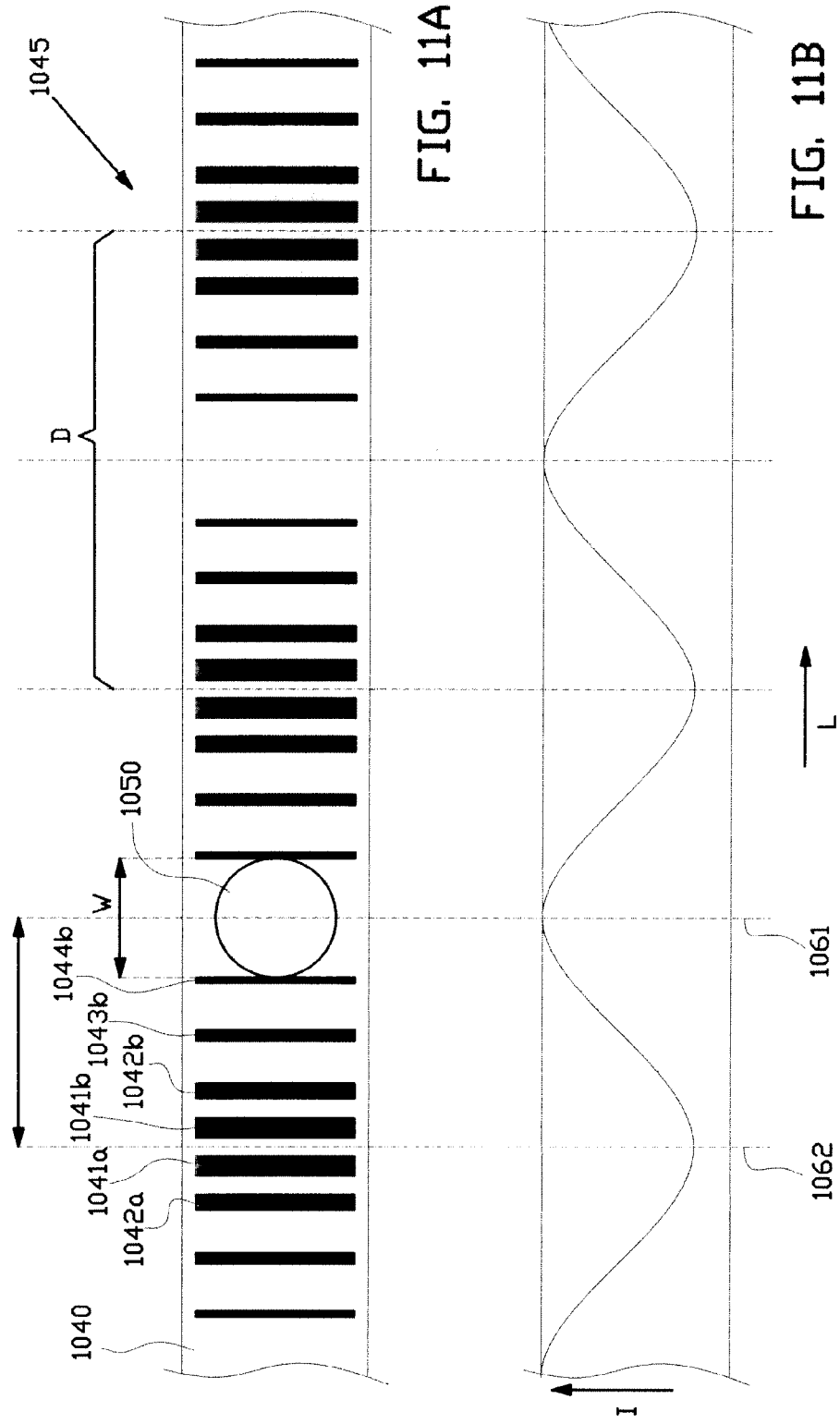

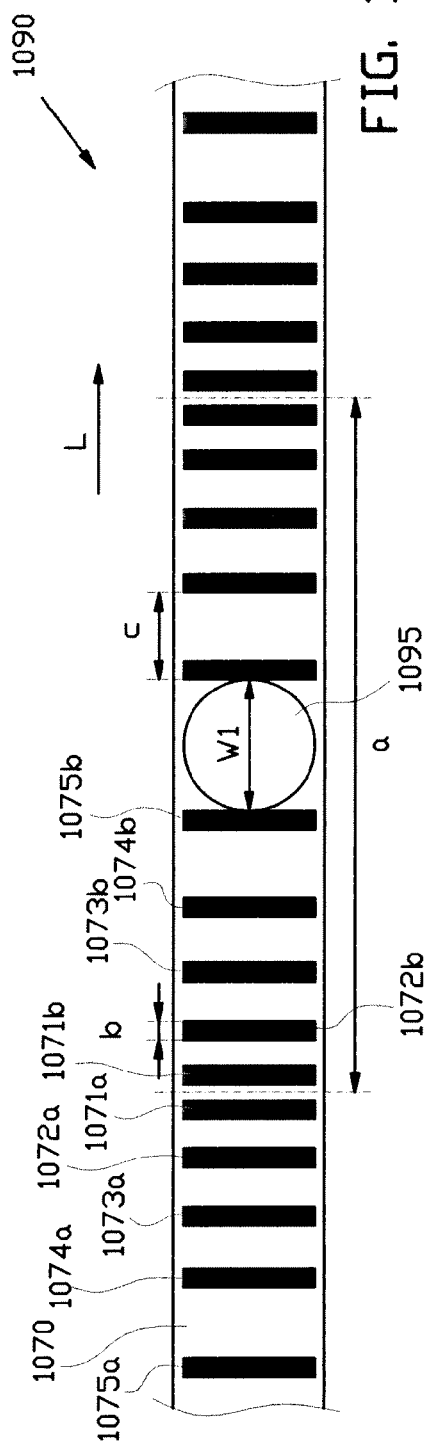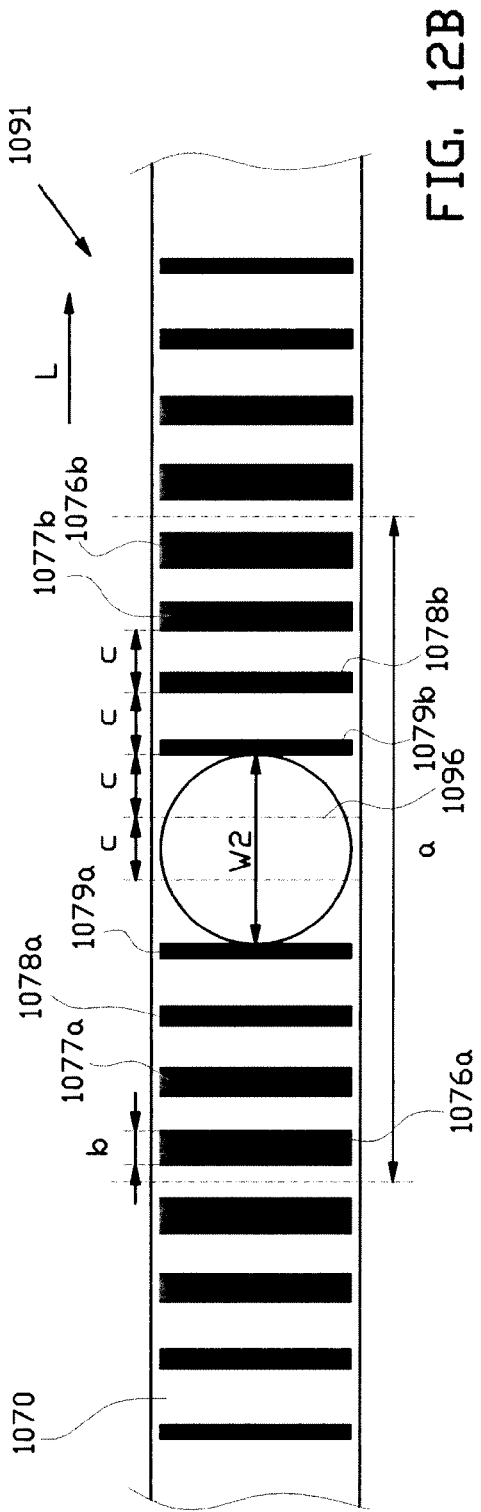

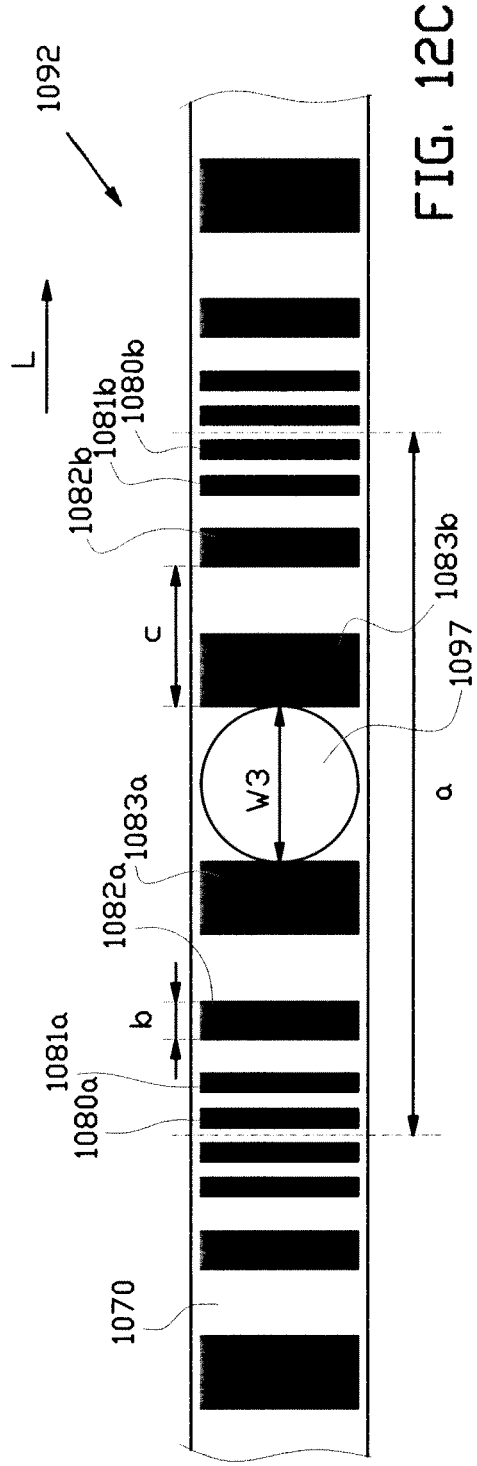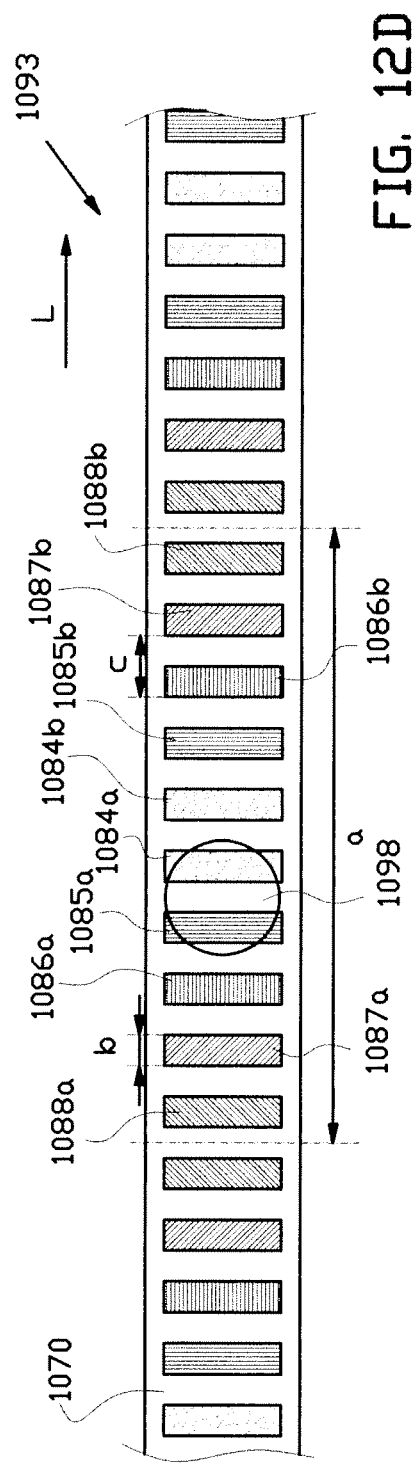

LITHOGRAPHY SYSTEM FOR PROCESSING A TARGET, SUCH AS A WAFER, A METHOD FOR OPERATING A LITHOGRAPHY SYSTEM FOR PROCESSING A TARGET, SUCH AS A WAFER AND A SUBSTRATE FOR USE IN SUCH A LITHOGRAPHY SYSTEM

This is a non-provisional application claiming the benefit of U.S. Provisional Application No. 61/478,126, filed Apr. 22, 2011, U.S. Provisional Application No. 61/491,862, filed May 31, 2011, U.S. Provisional Application No. 61/486,165, filed May 13, 2011, U.S. Provisional Application No. 61/491,867, filed May 31, 2011, U.S. Provisional Application No. 61/486,167, filed May 13, 2011, and U.S. Provisional Application No. 61/491,866, filed May 31, 2011.

According to a first aspect, the invention relates to a lithography system for processing a target, such as a wafer, and a method for operating a lithography system for processing a target, such as a wafer.

Systems for processing a target are known in the art, usually comprising a final projection system for projecting a pattern on the target surface and a system for determining the position of a wafer with respect to the final projection system. In general, these systems may use position marks on the wafer. Between a first and a second session of projecting a pattern, it may be required to remove wafer from the lithography system. In that case, it may be required that the position of the pattern of the second session is matched with the position of the pattern of the first session and that the position of the wafer with respect to the final projection system (or the patterning beam) may have to be determined twice, at the beginning of each session. However, it may be difficult to determine the position of the wafer with respect to the final projection system with a high reproducibility.

According to a second aspect of the invention, the invention relates to a substrate and method for position determination in a lithography system. In particular the invention relates to a substrate having provided thereon an at least partially reflective position mark comprising an array of structures, the array extending along a longitudinal direction of the mark, and a method for determining a position of such a substrate in a lithography system.

Position determination in lithography systems is generally known, normally using detection of light reflected in several diffraction orders, as is described for instance in U.S. Pat. No. 4,967,088. A disadvantage of determining a position using light reflected in several diffraction orders is that the light detectors for the different diffraction orders have to be accurately positioned in the system, thus increasing the cost of the system. Moreover, such systems are sensitive to slight errors in focus of the light beam or tilt of a substrate in relative to the light beam.

In order to at least partially overcome this problem, it has been suggested to provide a substrate comprising a checkerboard pattern of reflective squares, having a maximum reflection coefficient, and non-reflective squares, having a minimum reflection coefficient, wherein said squares have a width corresponding to a diameter of a cross-section of a light beam projected on said pattern. By measuring a reflected zero-th order intensity of the beam, a change in position of the beam relative to the substrate can be determined without measuring multiple diffraction orders. Ideally, when the beam spot of the light beam is moved over the pattern, the intensity of the reflected signal is a sinusoidal function with high contrast of the position of the beam spot on the pattern. However, in practice the intensity distribution of the beam spot generally does not correspond to a homogeneous and sharply cut-off disc-like profile but instead follows a Gaussian profile, the resulting reflected intensity signal does not closely resemble a sinusoid function as a function of the position of the beam on the substrate. As a result, the determination of the position of the beam spot on the substrate based on the intensity of the reflected beam is less accurate.

It is an object of the present invention according to the first aspect to provide an improved lithography system and method for processing a target, such as a wafer.

SUMMARY OF THE INVENTION

The object of the present invention is met by providing Lithography system for processing a target, such as a wafer, the target comprising a target surface with a target position mark provided thereon, the lithography system comprising:

- a beam source arranged for providing a patterning beam, preferably light beam or a charged particle beam, such as an electron beam;
- a final projection system arranged for projecting a pattern on the target surface with said patterning beam,
- a chuck arranged for supporting the target;
- an actuator system arranged for moving the chuck in at least one dimension with respect to the final projection system; and,
- a mark position system arranged for detecting a position mark on a surface, such as the target position mark on the target surface;

wherein the mark position system comprises at least one alignment sensor, the at least one alignment sensor comprising:

- a light source arranged for providing an alignment light beam;
- a light intensity detector arranged for determining a light intensity of a reflected alignment light beam, wherein the reflected alignment light beam is generated by reflection of the alignment light beam on said surface; and,
- an optical system arranged for focusing the alignment light beam on the surface and for guiding the reflected alignment light beam on the light intensity detector.

The detected light intensity of the reflected alignment light beam may depend on the presence of a position mark. In this way the position of the mark can be determined. Since the variation of the light intensity of the reflected alignment light beam may be detected at the central axis of the reflected alignment light beam, a single light intensity detector may be used, which may be positioned in the central axis of the reflected alignment light beam in a straightforward manner. Therefore, measuring second or higher order diffraction light beams may not be required.

Another advantage of this embodiment may be that this alignment sensor may be constructed in a relatively simple way with relatively small dimensions (with respect to the dimension of the final projection system).

In an embodiment of the lithography system according to the invention, the light source comprises a laser arranged for generating the alignment light beam and an optical fiber for guiding the alignment light beam from the laser to the optical system.

An advantage of the use of an optical fiber for guiding the light beam from the laser to the optical system may be that it enables that the laser is positioned outside a vacuum chamber of the lithography system, such that the heat that the laser may produce will not affect the temperature inside the vacuum chamber.

In an embodiment of the lithography system according to the invention, the optical system comprises a beam splitter arranged for guiding at least a part of the alignment light beam towards the surface and for guiding at least a part of the reflected alignment light beam towards the light intensity detector.

An advantage of a beam splitter is that the same optical path may be used for the alignment light beam towards the surface and for the reflected alignment light beam from the surface towards the light intensity detector. Therefore, alignment sensor may be constructed in a relatively small volume.

In an embodiment of the lithography system according to the invention, the light source comprises a collimator lens for collimating the alignment light beam from the light source.

In an embodiment of the lithography system according to the invention, the optical system further comprises another focus lens arranged for focusing the reflected alignment light beam on the light intensity detector.

In an embodiment of the lithography system according to the invention, the optical system further comprises a diaphragm positioned between the beam splitter and the light intensity detector.

An advantage of this embodiment is that the diaphragm may cause the signal/noise ratio of the light intensity detection to be increased.

In an embodiment of the lithography system according to the invention, the light source is arranged for providing a polarized alignment light beam, preferably a S-polarized alignment light beam; the beam splitter is a polarizing beam splitter, arranged for guiding the polarized alignment light beam towards the surface, preferably for guiding the S-polarized alignment light beam towards the surface; the optical system further comprises a quarter wave plate, which is located in a light path of both the alignment light beam and the reflected alignment light beam between the polarizing beam splitter and the surface, preferably arranged for converting the S-polarized alignment light beam into a right circular polarized alignment light beam and for converting a left circular polarized reflected alignment light beam into a P-polarized reflected alignment light beam, wherein the left circular polarized reflected alignment light beam is generated by reflection of the left circular polarized alignment light beam on the surface; and, the beam splitter is further arranged for guiding a polarized reflected alignment light beam towards the light intensity detector, preferably for guiding the P-polarized reflected alignment light beam towards the light intensity detector.

An advantage of this configuration is that in a polarizing beam splitter, the guiding of the light may be dependent on the polarization of the light. In this case, substantially all light from the alignment light beam may be guided towards the surface, while substantially all light from the reflected alignment light beam may be guided towards the light intensity detector. In a non-polarizing beam splitter, a much larger part of the alignment light beam may not be guided towards the surface and may thus be lost. Also, a much larger part of the reflected alignment light beam may not be guided towards the light intensity detector and may thus be lost.

In an embodiment of the lithography system according to the invention, wherein the at least one alignment sensor further comprises a height measurement system arranged for measuring the distance between the alignment sensor and the surface.

The spot size of the alignment light beam at surface should be small for an optimal contrast. The alignment sensor may be positioned such that the surface with the mark is located in the waist of the alignment light beam. However, the depth of focus of the alignment light beam that has been focused by the focus lens may be relatively small. Therefore, it may be necessary that the distance between surface and the alignment sensor is controlled. The height measurement system may provide the information for this control process.

In an embodiment of the lithography system according to the invention, the height measurement system is further arranged for measuring the tilt of the alignment sensor system with respect to the surface.

Tilt of the alignment sensor with respect to the surface may influence among others the direction of the reflected alignment light beam from the surface towards the alignment sensor. Since the optical system may be aligned for a reflected alignment light beam with a certain direction, a tilt may cause a loss of light intensity of the reflected alignment light beam. Therefore, it may be necessary that the tilt of the alignment sensor with respect to the surface is controlled. The height measurement system may provide the information for this control process.

In an embodiment of the lithography system according to the invention, the optical system further comprises a transparent plate positioned between the focus lens and the surface and the height measurement system is arranged on the transparent plate, wherein the height measurement system is facing the surface.

In an embodiment of the lithography system according to the invention, the height measurement system comprises two measuring electrodes, each having a half-moon-like shape and arranged to enclose a circular opening.

An advantage of this configuration is that the distance between the height measurement system and the surface may be measured at the location of the centre of the circular opening. Also the above-mentioned tilt may be measured at the location of the centre of the circular opening 55, using two pairs of measuring electrodes In an embodiment of the lithography system according to the invention, an incident angle defined by the alignment light beam and the surface is substantially equal to 90 degrees.

The advantage of this embodiment is that it enables the use of some same optical elements for the alignment light beam and the reflected alignment light beam.

In an embodiment of the lithography system according to the invention, the lithography system according to any of claims 1-12, further comprising said target.

In an embodiment of the lithography system according to the invention, the position mark comprises at least one trench.

When the alignment light beam is reflected on an edge of the trench in the surface, a phase difference will occur between light reflected on the lower part of the trench and light reflected on the higher part of the trench. As a result of (destructive) interference of the light reflected on the lower part of the trench and the light reflected on the higher part of the trench, the intensity of the reflected alignment light beam will be affected. The maximum effect may occur when half of the alignment light beam is reflected on the lower part of the trench and half of the alignment light beam is reflected on the higher part of the trench.

When the light beam is completely reflected on the bottom of the trench or completely reflected on the higher part of the trench, this type of interference may not take place.

In an embodiment of the lithography system according to the invention, the light source is arranged for providing an alignment light beam with a wavelength and the at least one trench has a depth, wherein the depth is substantially equal to a quarter of said wavelength.

An advantage of this configuration may be that the (destructive) interference may be at its maximum when the trench has a depth of a quarter wavelength, and the difference in optical path length is a half wavelength.

In an embodiment of the lithography system according to the invention, the position mark comprises at least a first and a second reflective area, wherein the first reflective area has a higher reflection coefficient that the second reflective area.

In the case of the mark comprising at least a first and a second reflective area, wherein the first reflective area has a higher reflection coefficient that the second reflective area, the light intensity of the reflected alignment light beam will depend on the local coefficient of reflection. An advantage of this embodiment may be that this kind of position mark may be constructed in a relatively simple way.

In an embodiment of the lithography system according to the invention, wherein the light source is arranged for providing an alignment light beam with a wavelength and at least one of the first and second reflective area comprises structures with dimensions smaller than said wavelength.

Sub-wavelength structures, i.e. structures with dimensions smaller than a certain wavelength are known to absorb a part of the light that is reflected on it.

In an embodiment of the lithography system according to the invention, wherein the position mark comprises an NVSM-X mark.

In an embodiment of the lithography system according to the invention, the mark position system is connected to the final projection system via a support, preferably a support ring supporting both the final projection system and the mark position system.

It may be important (see below) to maintain a distance between a beam axis of the final projection system and a beam axis of mark position system constant during a so-called initialization phase and a so-called exposure phase.

The term "beam axis of the final projection system" may refer to the beam axis of the beam that the final projection system may provide, while the term "beam axis of the mark position system" or the term "beam axis of the alignment sensor" may both refer to the axis of the (light) beam that the mark position system or alignment sensor transmit towards to surface in order to detect the position of a mark.

An advantage of connecting the mark position system to the final projection system via a support is that in that case the distance between them may be determined by the dimensions of the support only. Therefore, movements or deformations of other elements of the lithography system will not or to a lesser extend influence the distance between the beam axis of the final projection system and the beam axis of the alignment light beam provided by the mark position system.

In an embodiment of the lithography system according to the invention, the support comprises a low thermal expansion material, such as a glass-ceramic; and/or,
wherein a distance between a beam axis of the mark position system and a beam axis of the final projection system is relatively small compared to dimensions of the chuck, and/or is in the range of 10-100 mm or preferably in the range of 30-60 mm or more preferably about 45 mm.

The temperature inside a lithography system or the temperature of elements of a lithography system may vary over time. These temperature variations may cause these elements to deform. An advantage of providing a support comprising a low thermal expansion material (i.e. having a low thermal expansion coefficient) is that the temperature variations will not or to a lesser extend influence the dimensions of the support and thus of the distance between the final projection system and the mark position system.

The actual deformation (e.g. in micrometers) of elements of the lithography system is not only depend on the thermal expansion coefficient of the element but also on the dimensions of the element. When the distance between the mark position system and a beam axis of the final projection system is relatively small, an actual deformation may also be small.

In an embodiment of the lithography system according to the invention, the lithography system further comprises a frame and at least three flexures, wherein the support is suspended from the frame with the at least three flexures.

An advantage of this configuration is that the frame and/or the final projection system may expand due to temperature changes, while the beam axis remains at the same position. In that case, the position of the patterning of the surface may be independent of thermal expansion of the frame carrier and/or final projection system.

In an embodiment of the lithography system according to the invention, the light intensity detector is arranged for providing light intensity information based on a detected light intensity and the mark position system further comprises a processing unit, the processing unit being arranged for:
controlling the actuator;
receiving the light intensity information; and,
detecting a position of the position mark.

In an embodiment of a lithography system for processing a target, such as a wafer, the target comprising a target surface, the lithography system comprising
a beam source arranged for providing a patterning beam, preferably a light beam or a charged particle beam, such as an electron beam, the beam preferably comprising at least two beamlets;
a final projection system arranged for projecting a pattern on the target surface with said patterning beam;
a chuck arranged for supporting the target, wherein the chuck comprises a beam measurement sensor and a chuck surface provided with at least one chuck position mark thereon, the beam measurement sensor being arranged for measuring beam properties of the patterning beam, the beam properties comprising a spatial distribution of an intensity of the patterning beam and/or preferably a spatial distribution of the at least two beamlets;
an actuator system arranged for moving the chuck in at least one dimension with respect to the final projection system;
a chuck position sensor system, arranged for measuring the position of the chuck with respect to the final projection system in chuck position coordinates; and,
a mark position system connected to the final projection system and arranged for detecting a position mark on a surface, such as the at least one chuck position mark on the chuck surface.

The lithography system according to this embodiment of the invention enables the determination of a spatial relationship of the beam properties, which may comprise: (i) the position of the patterning beam, (ii) the position of the beamlets, (iii) the spatial distribution of the beam properties of the patterning beam with respect to the chuck position mark, and/or (iv) the spatial distribution of the beamlets. It may provide the spatial relationship of the beam properties with respect to the chuck position mark.

The actuator system may move the chuck in a position where the chuck position mark is detected by the mark position system. The position of the chuck position mark may be determined in chuck position coordinates.

The actuator system may move the chuck in another position in which the patterning beam is incident on the beam measurement sensor. The position of the beam measurement sensor may be determined in chuck position coordinates. The beam measurement sensor may be arranged for measuring beam properties of the patterning beam at different locations on the measuring surface of the beam measurement sensor. In this way, the spatial distribution of the beam properties of the patterning beam may be determined or calculated in chuck coordinates.

Using the determined position of the chuck position mark in chuck position coordinates, now the spatial distribution of the beam properties of the patterning beam may be determined with respect to the position of the chuck position mark.

The process with the steps described above may be referred to as the initialization phase. The process with the steps described below may be referred to as the exposure phase.

The spatial distribution of the beam properties of the patterning beam with respect to a location of a position mark may be used to determine the spatial distribution of the beam properties of the patterning beam with respect to a target position mark on the target, and thus with respect to the target. It may provide a spatial relationship of the beam properties with respect to the target position mark.

In this way, the position of the patterning beam and/or the spatial distribution of its beam properties may be determined and used when projecting a pattern on the surface of the target.

The determination of said spatial distribution or spatial relationship may take place before each session of projecting a pattern on the target.

In this way, the lithography system may be arranged for determining the position of the target or wafer with respect to the patterning beam with a high reproducibility.

In a further embodiment of the lithography system according to the invention, a distance between a centre of the beam measurement sensor and the chuck position mark corresponds to the distance between the beam axis of the mark position system and the beam axis of the final projection system. In another embodiment, the distance between the centre of the beam measurement sensor and the chuck position mark is substantially equal to the distance between the beam axis of the mark position system and the beam axis of the final projection system.

It may be the case that an error in a measurement by the chuck position sensor system of a distance between two points in chuck position coordinates is, among other, dependent of the distance, i.e. a larger measured distance may have a larger error. An advantage of these configurations is that the movement that is required to move the chuck from a position, in which the at least one chuck position mark is detected, to another position, in which beam properties are measured, is small or even absent. Thus the error may also be small. Please note that the position of the at least one chuck position mark may also be detected after beam properties are measured.

In a further or preferred embodiment, the flexures are arranged substantially (or at least predominately) vertically, which may imply substantially parallel to the beam axis of the final projection system.

In an embodiment of the lithography system according to the invention, the beam measurement sensor is further arranged for providing beam properties information based on the measured beam properties of the patterning beam, the chuck position sensor is further arranged for providing chuck position information based on a measured position of the chuck, the mark position system is further arranged for providing mark detection information based on a detected mark, and the lithography system further comprises a processing unit arranged for:

controlling the actuator;
receiving the mark detection information, chuck position information and beam properties information;
determining the position of the at least one chuck position mark in chuck coordinates;
determining a spatial distribution of beam properties in chuck coordinates; and,
determining a spatial distribution of beam properties with respect to the position of the at least one chuck position mark.

In an embodiment of the lithography system according to the invention, the target surface is provided with at least one target position mark thereon, and the mark position system is further arranged for detecting the at least one target position mark on the target surface. In a further embodiment of the lithography system according to the invention, the lithography system comprises said target.

In an embodiment of the lithography system according to the invention, the processing unit is further arranged for:
determining the position of the at least one target position mark in chuck coordinates;
determining a spatial distribution of beam properties with respect to the position of the at least one target position mark using the spatial distribution of beam properties with respect to the position of the at least one chuck position mark; and,
controlling the projecting of the pattern on the surface using the spatial distribution of beam properties with respect to the position of the at least one target position mark.

In an embodiment of the lithography system according to the invention, the patterning beam comprises at least two separate patterning beamlets and wherein the beam properties may comprise a spatial distribution of the at least two patterning beamlets and/or a spatial distribution of a light intensity of the at least two patterning beamlets.

An advantage of the use of at least two patterning beamlets is that more of the surface of a target may be processed at the same time. The beam measurement sensor may be arranged to measure the position of the at least two beamlets with respect to each other, and/or with respect to a reference beam frame, wherein the reference beam frame indicates where the at least two beamlet are intended to be positioned, i.e. without projection errors.

In this way, projections error of the beamlets may be measured and may be compensated for, for example by the final projection system. Therefore, a lithography system according an embodiment of the invention may be suitably adapted for projecting thousand or millions of beamlets simultaneously on the target.

In an embodiment of the lithography system according to the invention, the at least one chuck position mark comprises four chuck position marks, and/or the at least one target position mark comprises four target position marks. An advantage of these configurations may be that it enables a more accurate determining of a position (in x- and y-direction, and maybe in z-direction) and/or of a orientation or a rotational position (Rx, Rz and/or Ry).

In an embodiment of the lithography system according to the invention, the mark position system comprises at least one alignment sensor, the alignment sensor being arranged for providing an alignment light beam, for measuring a light intensity of a reflected alignment light beam, wherein the reflected alignment light beam is generated by reflection on the surface and, preferably, for providing mark detection information based on a measured light intensity.

The objective of the invention is also met by the provision of a method for operating a lithography system for processing a target, such as a wafer, the target comprising a target surface with a target position mark provided thereon, the method comprising:
focusing an alignment light beam on the surface;
guiding a reflected alignment light beam on a light intensity detector, wherein the reflected alignment light beam is generated by reflection of the alignment light beam on said surface;
moving said surface;
detecting the position of the mark based on the detected light intensity.

An embodiment of a method for operating a lithography system for processing a target, such as a wafer, is provided, said method comprising:
during an initialization phase:
a1) providing a chuck, the chuck comprising a beam measurement sensor and a chuck surface, the chuck surface provided with at least one chuck position mark thereon, wherein the chuck is moveable in chuck coordinates;
a2) determining a position of the at least one chuck position mark in chuck coordinates;
a3) providing a patterning beam, preferably comprising at least two beamlets;
a4) measuring beam-properties of the patterning beam, the beam properties comprising a spatial distribution of an intensity of the patterning beam; and/or preferably a spatial distribution of the at least two beamlets;
a5) determining a spatial distribution of the beam properties in chuck coordinates;
a6) determining a spatial distribution of the beam properties with respect to the position of the at least one chuck position mark.

It may be understood that step a2) may also be performed after step a4), instead of before step a3).

In a further embodiment of the method according to the invention, the method further comprises:
during an exposure phase:
b1) providing a target with a target surface, the target surface provided with at least one target position mark thereon;
b2) determining the position of the at least one target position mark in chuck coordinates;
b3) determining a spatial distribution of beam properties with respect to the position of the at least one target position mark using the spatial distribution of beam properties with respect to the position of the at least one chuck position mark; and,
b4) patterning the target surface using the spatial distribution of beam properties with respect to the position of the at least one target position mark.

In a further embodiment of the method according to the invention, the method further comprises the step of:
maintaining a distance between a beam axis of the final projection system and a beam axis of mark position system constant during the initialization phase and the exposure phase.

The advantages of these embodiments of the method according to the invention may be similar to the advantages of the embodiments of the lithography system as described above.

Furthermore, according to a second aspect, the present invention provides a substrate for use in a lithography system, for example a lithography system as described above, said substrate being provided with an at least partially reflective position mark comprising an array of structures, the array extending along a longitudinal direction of the mark, wherein said structures are arranged for varying a reflection coefficient of the mark along the longitudinal direction, wherein said reflection coefficient is determined for a predetermined wavelength, wherein a pitch between a first structure of the array and a second structure of the array neighboring said first structure is different from a pitch between said second structure and a third structure of the array neighboring said second structure, and wherein pitch between neighboring structures along the longitudinal direction follows a sinusoid function of the position of said structures along the longitudinal direction. As the pitch between said structures varies according to a sinusoid function, the degree in which an intensity signal of a beam partially reflected by said substrate when the beam is moved over the substrate along the longitudinal direction follows a sinusoid function is substantially less dependent on the beam profile. As a result, the reflected intensity signal may follow a substantially sinusoid function when the beam has a Gaussian or other profile which differs from a sharply defined homogeneous disc-like profile. As an extreme example, if the beam-spot were square, the resulting intensity signal of a beam reflected in the substrate could still be substantially sinusoid.

Herein, a pitch between neighboring structures is defined as the distance between an outer edge of a structure to be covered by the beam spot, and a corresponding edge of the neighboring structure. For instance, when the structures, at least those parts of the structure intended to be illuminated by a beam, are substantially rectangular in shape, with a leftmost edge of each structure substantially perpendicular to the longitudinal direction, the pitch would be defined as the distance between the leftmost edge of a structure to the leftmost edge of a neighboring structure.

The amount of energy of a beam of said wavelength reflected by the position mark thus varies dependent on the position of a beam spot on the mark, such that a position of the beam spot on the position mark may be determined by simply measuring the intensity of the reflected beam.

In an embodiment the structures are arranged for varying a specular reflection coefficient of the mark along the longitudinal direction. A beam reflected beam in the position mark thus preferably comprises only the specular, or zeroth order reflection. Thus, the positioning system used for determining the intensity of the reflected can be kept simple and compact. Moreover, the position determination is not substantially affected by small variations in alignment between the beam spot on the position mark and a beam intensity detector for measuring the intensity of the reflected beam. The substrate according this embodiment allows standard off the shelf DVD- or CD-heads and the like to be used for determining the intensity of a specularly reflected beam, and thus for determining a position of the beam spot in the position mark on the substrate. In a preferred embodiment the structures are arranged substantially absorbing higher order diffractions by multiple reflection of said higher order diffractions within the mark. The multiple reflection may comprise both specular and diffuse reflection.

In an embodiment the structures each have a width along the longitudinal direction, said width being less than said predetermined wavelength, wherein a distance between neighboring structures along the longitudinal direction is less than said predetermined wavelength. In this embodiment the structures used are sub-wavelength structures which affect the reflection coefficient of an area on the position mark yet which may not be individually resolved using a beam of the predetermined wavelength. Using such sub-wavelength structures a very gradual variation in reflection coefficient may be achieved in the position mark along the longitudinal direction.

In an embodiment the structures are aligned on points which are equidistantly spaced along the longitudinal direction. For instance, the structures may be aligned with their left most edge on such an equidistant point. At least some of these equidistantly spaced points may be free of a corresponding structure. Thus a substrate may be provided having a number of consecutive structures at a pitch c which pitch c is equal to the distance between the equidistanced points, and wherein a further structure is at a different pitch from its neighboring structure which is an integer multiple of said pitch c. This embodiment allows further variation in position of the structures. Preferably, the substrate is adapted to be used with a light beam projected onto said substrate, said light beam having a cross-sectional diameter which is larger that a distance between two neighboring of said equidistant points.

In an embodiment a first structure of said structures has a different width along the longitudinal direction than a second structure of said structures, allowing further variation of the reflection coefficient of the mark along the longitudinal direction.

In an alternative embodiment the structures have substantially identical dimensions, allowing easy fabrication. In this embodiment the structures preferably have rectangular shapes which are easily produced on a substrate with high accuracy.

In an embodiment the distance between neighboring structures along the longitudinal direction of the mark is substantially equal to a width of a structure. In this embodiment a substantially sinusoidal reflected beam intensity signal is obtained when a disc-shaped beam spot having a diameter equal to the width of the structures is moved across the position mark.

In an embodiment a maximum distance between neighboring structures along the longitudinal direction is at most 610 nm, preferably within a range of 590 nm to 610 nm, preferably substantially equal to 600 nm. Such a substrate is particularly well suited to be used in combination with an off-the shelf CD- or DVD head, capable of projecting a light beam with a spot diameter of 590 nm to 610 nm, preferably 600 nm onto the substrate.

In an embodiment the substrate is adapted for cooperation with a positioning system which is adapted for emitting a light beam onto the substrate for generating a beam spot on said substrate, wherein the light beam has a wavelength equal to the predetermined wavelength, wherein a maximum distance between neighboring structures along the longitudinal direction is at most equal to the diameter of the beam spot. By spacing the structures no father apart than the diameter of the beam spot, any movement of the beam spot on the position mark may result in a change in absorption of part of the beam by a structure. Moreover, when the beam is positioned exactly between two structures which are spaced apart a distance equal to the diameter of the beam, the area of the mark between these structures provides a maximum reflection coefficient.

In an embodiment the structures form a periodic pattern of structures repeating along said longitudinal direction, wherein the period of said pattern is larger than said diameter of the beam spot, preferably at least twice as large. Preferably the periodic pattern of structures has a periodicity of 2 micron or less, and preferably the beam spot has a diameter of approximately 600 nm.

In an embodiment the pitch between neighboring structures is less than or equal to the diameter of the beam spot, ensuring that a beam spot on the position mark always at least partially covers one of said structures.

In an embodiment the structures are dimensioned and arranged for varying the reflection coefficient as a sinusoidal function of the position of beam spot on the position mark along the longitudinal direction. A coarse alignment or position of the beam spot on the position mark may thus be determined by counting maxima in a reflected beam intensity, and a more fine-grained alignment or position may be determined by comparing the reflected beam intensity signal with a maxima and minima of the reflected beam intensity signal measured thus far.

In an alternative embodiment the mark has a varying reflection coefficient which is monotonically increasing along substantially the entire length of the mark in the longitudinal direction, preferably strictly increasing, allowing absolute alignment or position determination of a beam spot on a substrate.

In an embodiment the substrate is formed as an integrated unit from a single material, preferably silicon. The substrate preferably comprises a wafer, wherein the position mark is preferably provided on one or more scribe-lines of said wafer. The position and/or alignment of a beam spot on the wafer can thus be determined. In an embodiment the substrate is provided on an edge of a target carrier, for determining the position and/or alignment of a beam spot on the target carrier.

In an alternative embodiment a first of said structures comprises a first material and a second of said structures comprises a second material having a different reflection coefficient than said first material. For example, the position mark may comprise a silicon surface on which a first structure is provided in the form of a sub-wavelength silicon structure, and wherein other structures are provided comprising different material such as aluminum, copper, and/or silicondioxide, the other structures having a dimension along the longitudinal direction which is greater than the wavelength. This embodiment thus provides a further class of substrates provided with structures which vary a reflection coefficient along the mark.

In an embodiment a maximum reflection coefficient of an area of the position mark for said wavelength is substantially equal to 1. The reflected intensity signal may thus vary between the minimum reflection coefficient of an area of the position mark, which is typically substantially equal to 0, and the maximum reflection coefficient, such the need to further amplify the reflected signal to obtain a measurable signal is reduced.

In an embodiment a specular reflection coefficient varies along the substrate, wherein high order diffractions are substantially absorbed by the substrate. A position of a beam on a substrate can thus be determined based on the intensity of its reflection in the substrate.

According to a third aspect the present invention provides a position device arranged for determining a position of a beam on a position mark of a substrate described herein, said position device comprising a beam source arranged for providing a light beam of said predetermined wavelength, a beam intensity detector arranged for determining an intensity of a reflected light beam, wherein the reflected light beam is generated by reflection of the light beam on said position mark, an optical system arranged for focusing the light beam on the position mark and for guiding the reflected light beam on the beam intensity detector, wherein said beam intensity detector is arranged for detecting a light beam intensity for the zeroth order reflection of the reflected light beam and adapted for providing a signal representative of the reflected beam intensity. The beam detector preferably comprises a single photodiode. As the position is determined is based on the intensity of the zeroth order reflection of the beam, no separate beam detector units are needed for detecting different orders. Preferably only the zeroth order reflection is guided onto the beam intensity detector. However, in an embodiment one or more higher order reflections, specifically the first order reflection, may be guided onto the same beam intensity detector as well, wherein the beam intensity detector is adapted for detecting an intensity of the combined reflections at the detector. In both embodiments construction of the position device remains simple, as only one beam intensity detector is necessary for to detect a reflection intensity of a single beam projected onto the substrate.

According to a fourth aspect the present invention provides a lithography system for processing a target, said system comprising a substrate as described herein, said system comprising an alignment beam source arranged for providing an alignment beam of said predetermined wavelength, an alignment beam intensity detector arranged for determining an intensity of a reflected alignment beam, wherein said reflected alignment beam is generated by reflection of the beam on said position mark, an optical system arranged for focusing the alignment beam on the position mark and for guiding the reflected alignment beam on the alignment beam intensity detector, wherein said alignment beam intensity detector is arranged for detecting an alignment beam intensity of the zeroth order reflection of the reflected alignment beam. The lithography system according to the invention is thus provided with means for determining the alignment and/or position of a substrate relative to a beam spot of the alignment beam. Typically the substrate is moveable with respect to the alignment beam, in particular with respect to the beam spot thereof.

In an embodiment the lithography system further comprises a target carrier, adapted for moving the target relative to the optical system along the longitudinal direction, wherein said substrate is provided on the target carrier and/or on the target, a processing unit adapted for determining a alignment and/or position of the substrate relative to the optical system based on the detected intensity of the reflected alignment beam. The lithography system according to the invention is thus provided with means for determining an alignment and/or position of the target within the system. The optical system is preferably fixedly attached to the lithography system to facilitate position determination of the target relative to the optical system.

In an embodiment the lithography system further comprises an optical column adapted for projecting one or more exposure beams on the target, wherein the optical system is attached to the optical column. The optical system is preferably attached close to a distal end of the optical column, in particular close to the target end of the optical column. Alignment and/or position determination of an area of the target to be exposed may thus be carried out close to the target and/or the substrate.

In an embodiment the optical column is adapted for projecting a multitude of charged particle exposure beams through the onto the target, and wherein said optical system is mounted on or near a downstream portion of the optical column, preferably within a distance of 100 micron to an outer exposure beam thereof.

In an embodiment the optical system is, at least during use, arranged at a distance of 2 mm or less from the substrate, providing a very compact system for position determination.

In an embodiment the optical system is arranged for projecting said alignment beam onto the substrate substantially perpendicular on said substrate. As the specular reflection will be excident substantially perpendicular to the substrate and back into the optical system, a compact system for position determination is provided.

According to a fifth aspect the present invention provides a method for manufacturing an alignment and/or positioning mark on a substantially reflective substrate to be illuminated by a beam, comprising a step of providing structures on the substrate, each structure arranged within a distance of a beam wavelength from a neighboring structure, said structures adapted to substantially absorb the energy of said incident beam. Part of the mark covered by the structures thus substantially absorbs an incident beam, whereas part of the mark not covered with structures substantially specularly reflects an incident beam, thus providing a substrate having reflection coefficient which varies along its surface.

In an embodiment said structures are provided on the substrate at different distances and/or pitches from each other.

In an embodiment said structures form a pattern with a period greater than a diameter of a beam spot of said beam.

According to a sixth aspect the present invention provides a method for alignment and/or position determination of a beam spot on a substrate as described herein, said method comprising the steps of illuminating the substrate with a light beam, detecting an intensity of a specular reflection of said light beam, determining, based on said detected intensity, a position and/or alignment of substrate relative to the beam spot. The method thus provides a simple yet accurate way to determine the position and/or alignment of a substrate relative to a beam spot or optical system emitting the beam spot.

In an embodiment the method further comprises a step of measuring a position of the substrate using a further measurement system, wherein the position and/or alignment of the substrate is further determined based on the measurement by the further measurement system. The further measurement system for instance comprises an interferometer and/or feedback loop for actuators for moving the substrate relative to the light beam. Preferably, alignment of the beam spot is initially performed based on the measured intensity of the beam reflected by the substrate, after which further position determination during processing of a target is based on the measurements by the further measurement system.

According to a seventh aspect, the present invention provides a substrate for use in a lithography system, said substrate being provided with an at least partially reflective position mark comprising an array of structures, the array extending along a longitudinal direction of the mark, wherein said structures are arranged for varying a reflection coefficient of the mark along the longitudinal direction, wherein said reflection coefficient is determined for a predetermined wavelength. The amount of energy of a beam of said wavelength reflected by the position mark thus varies dependent on the position of a beam spot on the mark, such that a position of the beam spot on the position mark may be determined by simply measuring the intensity of the reflected beam.

In an embodiment a pitch between a first structure of the array and a second structure of the array neighboring said first structure is different from a pitch between said second structure and a third structure of the array neighboring said second structure. By varying the pitch between structures along the longitudinal direction a substantially greater variation in reflection coefficient may be achieved than when the pitch is fixed as is for instance the case when position measurement is based on measured beam intensities of several diffraction orders.

In an embodiment the pitch between neighboring structures along the longitudinal direction follows a sinusoid function of the position of said structures along the longitudinal direction. The structures are thus arranged for smoothly varying the reflection coefficient of the position mark along the longitudinal direction.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which:

FIG. 10 shows a prior art positioning system, for determining a position of a target relative to an optical column;

FIG. 11A shows a substrate according to the invention, provided with rectangular beam absorbing structures;

FIG. 11B shows a reflected intensity signal of a beam moving along the longitudinal direction over the substrate of FIG. 11A;

FIGS. 12A, 12B, 12C and 12D show embodiments of a substrate according to the present invention; and, FIG. 13 schematically shows a position device adapted for providing a beam for cooperation with a substrate according to the invention, and for detecting an intensity of a reflection of said beam in said substrate.

DETAILED DESCRIPTION OF THE INVENTION

Figure 1:
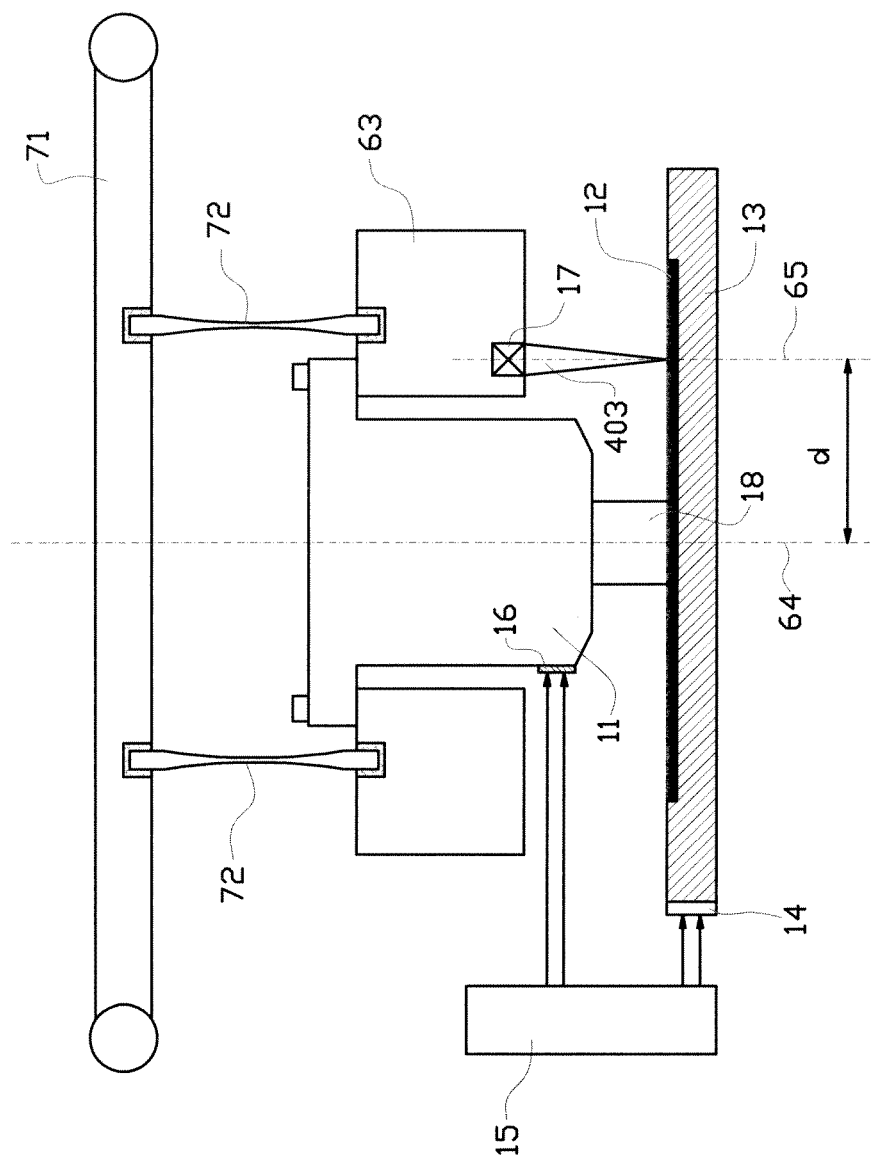
FIG. 1 shows a schematic overview of parts of embodiments of a lithography system according to the invention.

FIG. 1 shows a schematic overview of parts of embodiments of a lithography system according to the invention.

A final projection system 11 may be arranged for receiving a patterning beam from a beam source. The beam source is not shown in FIG. 1, but an example may be seen in FIG. 8. The final projection system 11 may comprise collimators, lenses or other (electro)-optical elements to shape and/or direct the patterning beam. The final projection system may be a (final) part of a projection column, the projection column comprising the beam source, deflector and other (electro)-optical elements. The projection column may be an optical projection column or a charge particle optical projection column.

The patterning beam 18 is directed towards a surface 12. This surface 12 may be surface of a target, such as a wafer or the measuring surface of a beam measurement sensor. The beam measurement sensor and/or the target/wafer may be provided on a chuck 13.

The chuck 13 may be moveable in at least one dimension (x) or direction. In an embodiment, the chuck 13 is moveable in two (x, y) or three (x, y, z) dimensions. It is also possible that chuck 13 is moveable in at least one rotational (Rz), two rotational (Rz, Ry) or three rotational directions (Rx). The chuck may be provided with at least one chuck position mirror 14.

The lithography system may be provided with an actuator system. The actuator system is not shown in FIG. 1, but an example be seen in FIG. 8. The actuator system may be arranged for moving the chuck in one of the above-mentioned directions. Such actuators systems may be known in the art.

In FIG. 1 an embodiment of a chuck position sensor system is shown, comprising a differential interferometer 15. The differential interferometer may use two mirrors, a chuck position mirror 14 and a final projection system position mirror 16. In this way the interferometer is arranged to detect or measure movements of the chuck 13 with respect to the final projection system 11.

The chuck position sensor system may comprise more than one differential interferometers 15 in order to detect the position of the chuck in more than one direction.

It may be understood that also other types of chuck position sensor systems may be used for determining a position of the chuck 13 with respect to the final projection system 11.

The lithography system may be provided with a mark position system 17. The mark position system 17 is arranged for detecting a position mark on a surface. Such a position mark may be provided on a surface of chuck 13, i.e. a chuck position mark or it may be provided on a surface of a target, i.e. a target position mark.

Figure 2:
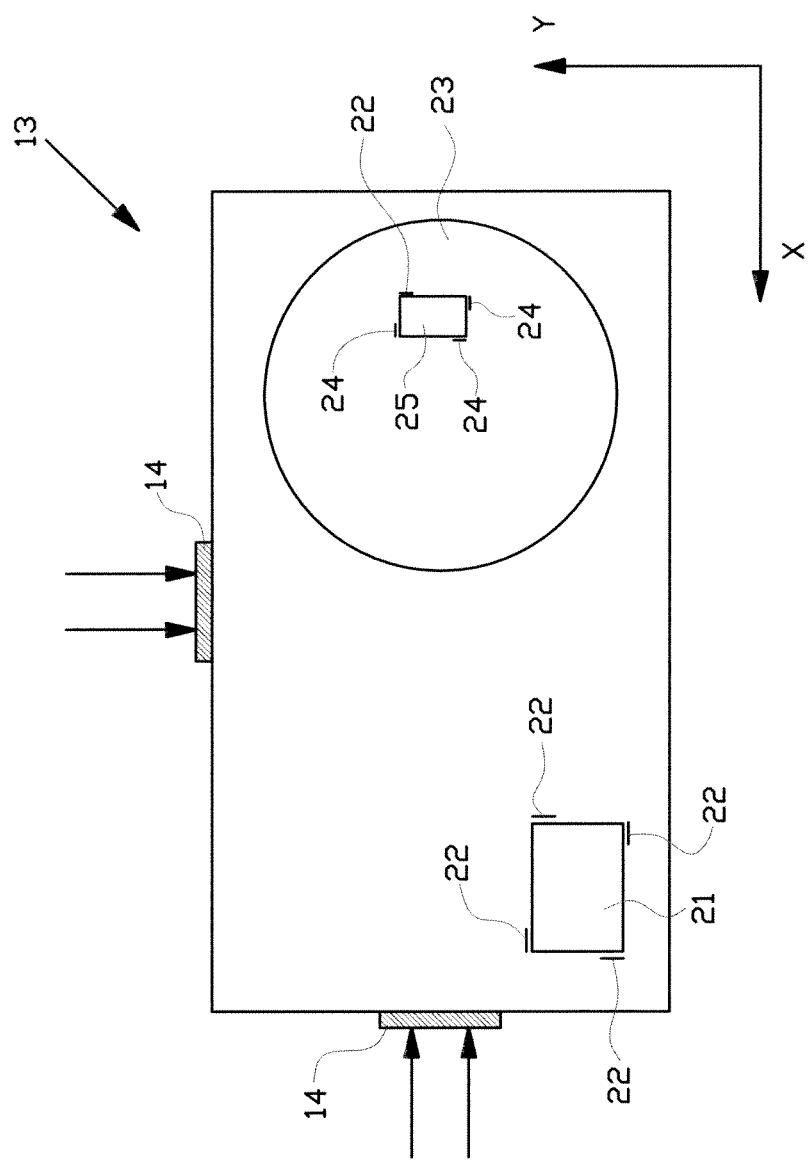
FIG. 2 shows a schematic top view of an embodiment of a chuck.

FIG. 2 shows a schematic top view of an embodiment of a chuck 13. The chuck 13 is provided with a beam measurement sensor 21 and chuck position marks 22. In FIG. 2 the chuck 13 is provided with four chuck position marks but any other number of chuck position marks 22 may also be provided. The beam measurement sensor in FIG. 2 has a rectangular shape but it may also have a circular or another shape. The four chuck position marks may be positioned at the ends of the sides of the rectangular shape, wherein none of the chuck position marks is adjacent to another.

The chuck 13 may be supporting target 23, for example a wafer. The surface of the target may be provided with four target position marks 24. The target position marks 24 are arranged around an exposure field 24. A target may comprise many exposure fields. An exposure field may have a rectangular shape. Also the four target position marks may be positioned at the ends of the sides of the rectangular shape, wherein none of the target position marks is adjacent to another. The chuck 13 may be provided with two chuck position mirrors 14. The chuck 13 may be movable in an x- and a y-direction, thus also the beam measurement sensor and the target.

Figure 3:
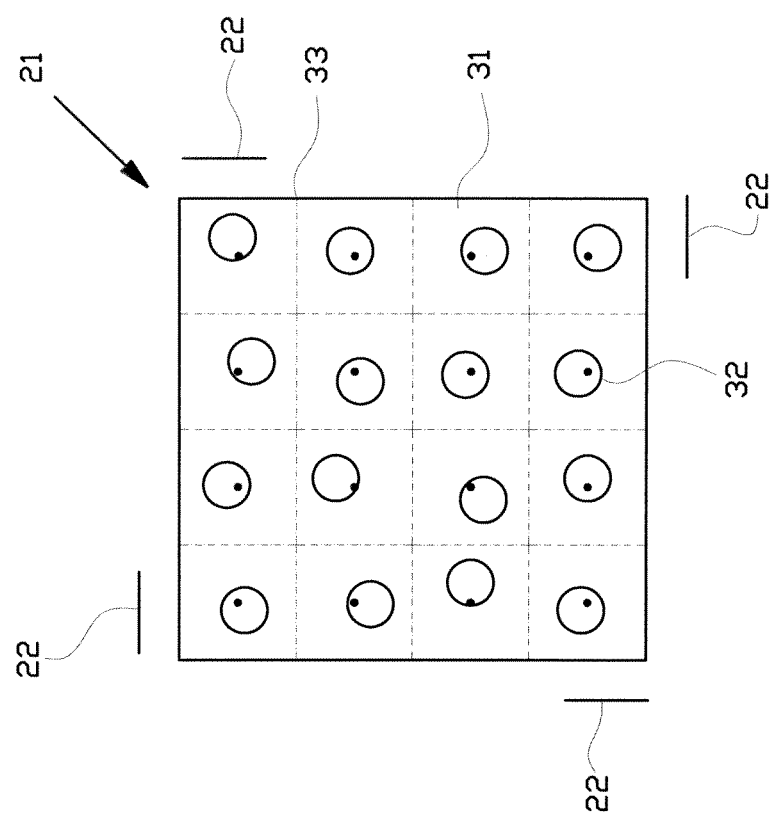
FIG. 3 shows a schematic top view of an embodiment of a beam measurement sensor.

FIG. 3 shows a schematic top view of the beam measurement sensor 21. The beam measurement sensor may comprise a (measuring) surface 31 which may be arranged for detecting an intensity of an incident beam as a function of the position it is incident on the surface 31.

The beam may comprise several beams, referred to as beamlets. These beamlets may be generated by splitting a beam, for example, by the final projection system. Also, the final projection system may be arranged for shaping each beamlet individually. In the example of FIG. 3, the beam comprises twelve beamlets. Their incident spots have been indicated by twelve open circles 32.

The beam measurement sensor may be thought of having a reference beam frame 33. In the reference beam frame 33 the intended position of the twelve beamlets is indicated by a dot. In other words, if the final projection system would be able to perfectly project the beam, comprising the beamlets, on a surface, the beamlets would be incident on the intended positions. However, projections error will probably occur and in FIG. 3 it is shown, as an example, how many beamlets hit the surface at different positions then their intended positions. The difference between the intended position and the measured position may be referred to as the projection error of said beam or said beamlet.

The beam measurement sensor may be arranged for measuring the projection error of the beam or the beamlets. The beam measurement sensor may be arranged for measuring the distance between two or more incident spots of the beamlets. In both ways, a spatial distribution of the beam intensity, i.e. one of the possible beam properties of a beam, may be determined.

Below operation of the lithography system according to an embodiment of the invention, for example the embodiment of FIGS. 1, 2 and/or 3, is described. The operation may be described referring to an initialization phase and an exposure phase.

In a first step of the initialization phase, the actuator may move the chuck in order to determine the position of the chuck position marks. The chuck position marks may be detected when they are at a location where the mark position system is able to detect them. The mark position system may comprise more than one alignment sensor. In that case, more than one chuck position mark may be detected at the same time. When the number of chuck position marks is larger than the number of alignment sensors, it may be necessary to move the chuck in order to detect all chuck position marks.

The position of each chuck position mark may be determined in chuck position coordinates. That may imply that whenever a chuck position mark is detected, the position of the chuck detected by the chuck position sensor system in chuck coordinates is referred to as the position of the chuck position mark in chuck coordinates. The chuck position marks may also provide information about the position and/or orientation of the beam measurement sensor in chuck position coordinates.

In a next step, the chuck is positioned in a position where the beam measurement sensor may receive the patterning beam from the final projection system. This position may also be expressed in chuck position coordinates. The beam measurement sensor may then be used to determine a spatial distribution of beam properties, for example the intensity of the beamlets as a function of the incident spot location on the surface of the beam measurement sensor.

Because the position and the orientation of the beam measurement sensor can be related to the position of the chuck position marks, the spatial distribution may be determined with respect to the chuck position marks. For example, the chuck position marks may be used to define a coordinate system. The position of each beamlet, or the position of a maximum of the beam intensity of each beamlet, may then be expressed in de coordinates of this coordinate system. A set of locations of the beamlets in this coordinate system may be referred to as a spatial distribution of beam properties with respect to the chuck position marks.

After the above-described initialization phase, an exposure phase may take place. In a first step of the exposure phase, the actuator may move the chuck in order to determine the position of the target position marks. The target position marks may be detected when they are at a location where the mark position system is able to detect them. When the number of target position marks is larger than the number of alignment sensors, it may be necessary to move the chuck in order to detect all target position marks.

The position of each target position mark may be determined in chuck position coordinates. Whenever a target position mark is detected, the position of the chuck detected by the chuck position sensor system in chuck coordinates is referred to as the position of the target position mark in chuck coordinates. The target position marks may also provide information about the position and/or orientation of the target and/or one or more exposure fields in chuck position coordinates.

When more than one target position mark is provided, the target position marks may be used to determine the position and/or orientation of the said coordinate system on the target surface. The spatial distribution of beam properties with respect the target position marks or with respect to said coordinate system may thus be determined using the position of the target position marks and the spatial distribution of beam properties with respect to the chuck position marks. Also in this case, a set of locations of the beamlets in said coordinate system may be referred to as a spatial distribution of beam properties with respect to the chuck position marks.

In a next step, the spatial distribution of beam properties with respect the target position marks or with respect to the coordinate system may be used to project a pattern on the target surface.

Figure 8:
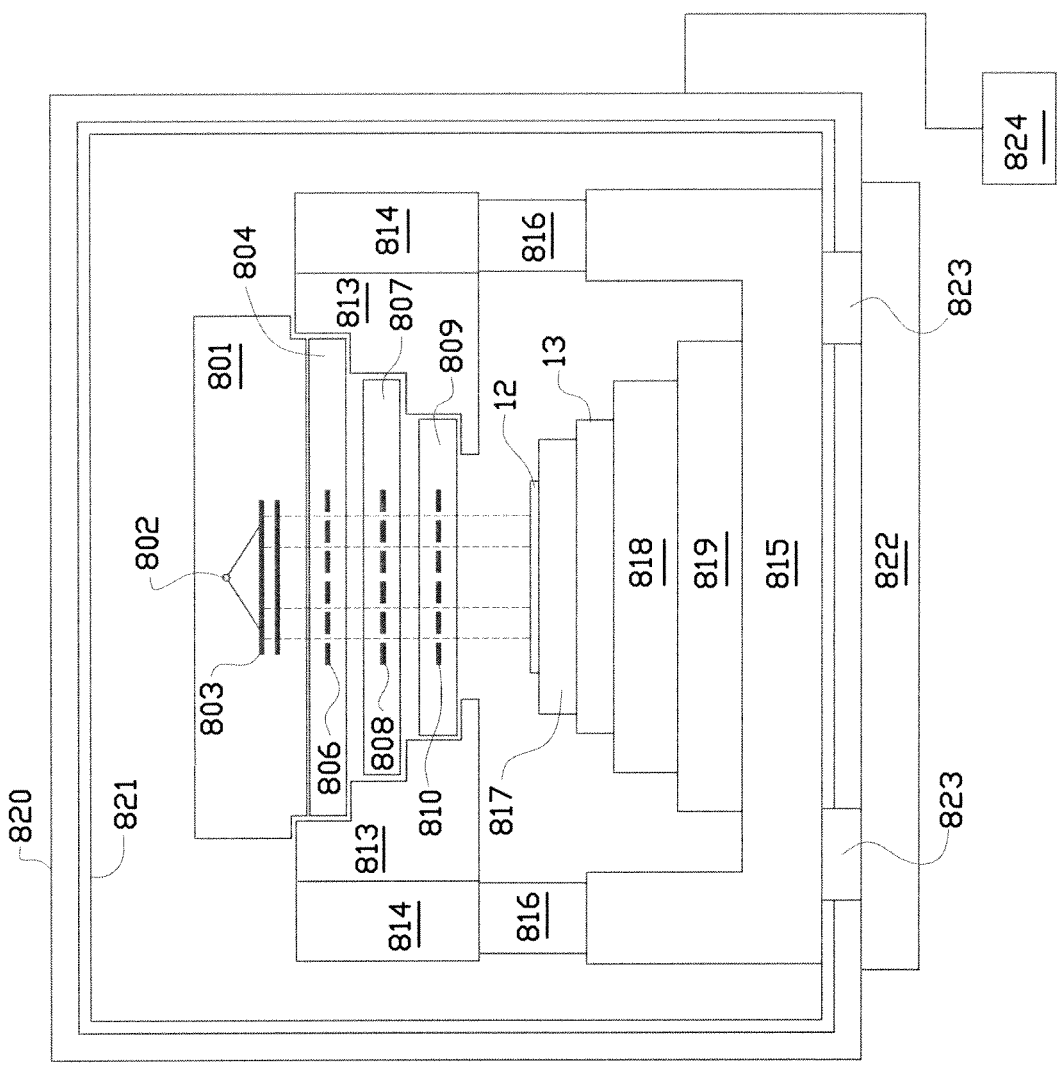
FIG. 8 shows a schematic overview of a lithography system according to an embodiment of the invention.

In an embodiment of the lithography system, the system may comprise a processing unit. An example of a processor unit is shown in FIG. 8. The processing unit may be arranged for performing and/or controlling the above-mentioned steps or activities. For example, the processing unit may be arranged for one or more of the following steps:
  controlling the actuator;
  receiving the mark detection information, chuck position information and beam properties information;
  determining the position of the at least one chuck position mark in chuck coordinates;
  determining a spatial distribution of beam properties in chuck coordinates; and,
  determining a spatial distribution of beam properties with respect to the position of the at least one chuck position mark.
  determining the position of the at least one target position mark in chuck coordinates;
  determining a spatial distribution of beam properties with respect to the position of the at least one target position mark using the spatial distribution of beam properties with respect to the position of the at least one chuck position mark; and,
  controlling the projecting of the pattern on the surface using the spatial distribution of beam properties with respect to the position of the at least one target position mark.

The processing unit may be arranged for receiving one or more of the following: (i) beam properties information, provided by the beam measurement sensor based on the measured beam properties of the patterning beam, (ii) chuck position information, provided by the chuck position sensor based on a measured position of the chuck, (iii) mark detection information, provided by the mark position system based on a detected mark.

In FIG. 1 (and in FIG. 6) a distance between a beam axis 64 of the final projecting system and an alignment light beam axis 65 of the mark position system is indicated by d. When this distance d is during the exposure phase different from the distance d during the initialization phase, position errors may occur during the patterning of the target surface.

In an embodiment, the mark position system 17 may be connected to the final projection system 11 via a support or support ring 63 as in shown in FIGS. 1 (and 6). The support ring may comprise a low thermal expansion material, such as glass-ceramics, Pyrex and/or Zerodur. Furthermore, the distance between the beam axis 64 of the final projection system and the beam axis 65 of the alignment sensor may be relatively small compared to dimensions of the chuck, and/or to the dimensions of the final projection system, and/or is in the range of 10-100 mm or preferably in the range of 30-60 mm or more preferably about 45 mm. In this way, the deformation of the support ring (e.g. in micrometers) due to temperature changes may be limited.

Figure 4:
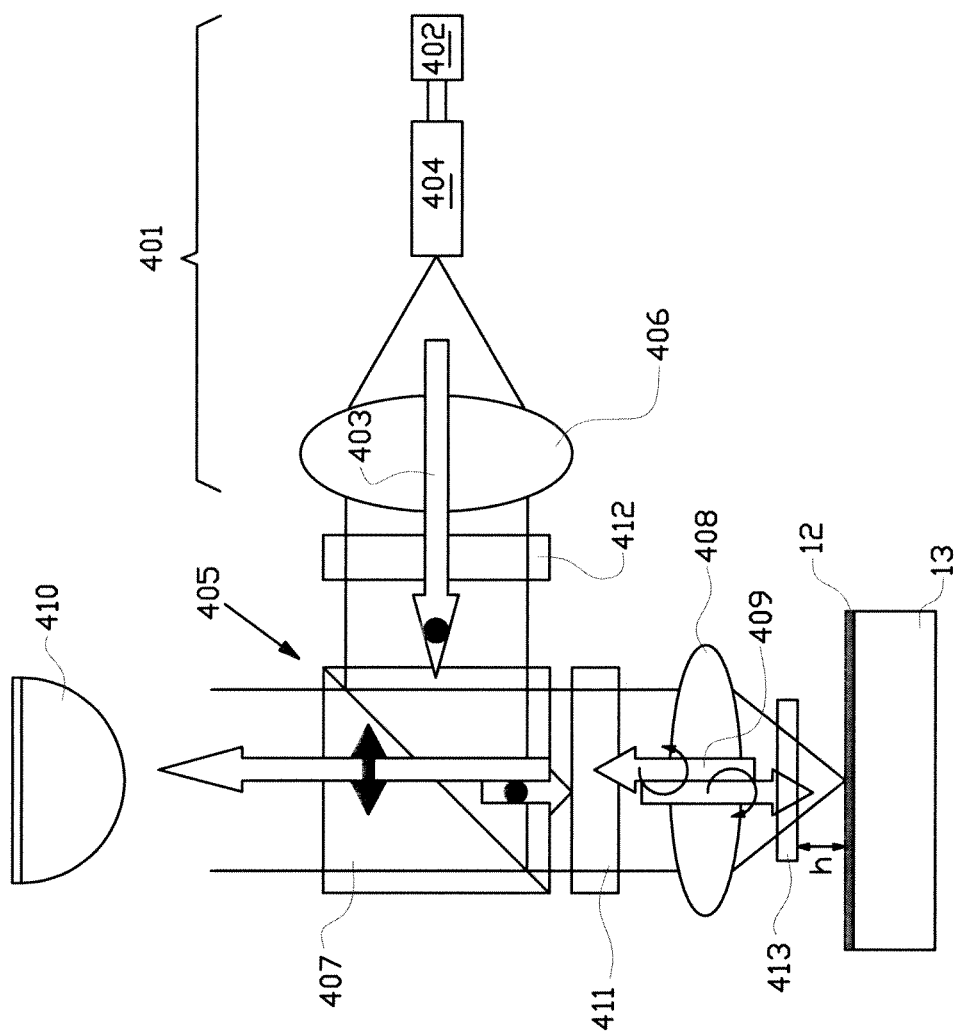
FIG. 4 shows schematically an overview of an alignment sensor according to an embodiment of the invention.

FIG. 4 shows schematically an overview of an alignment sensor according to an embodiment of the invention.

The light source 401 may comprise a laser 402 for providing an alignment light beam 402. The laser 402 may be arranged for providing an alignment light beam 403 with a wavelength in the range of 600-650 nm, or about 635 nm. The light source 401 may further comprise an optical fiber 404 for guiding the light beam 403 from the laser 402 towards the optical system 405. The alignment light beam leaving the optical fiber 404 may have nearly perfect Gaussian profile and may be easily collimated. The light source may comprise a collimator lens 406 arranged for collimating the light beam 403 from optical fiber 404. However, when a fiber is not used and the laser or another light generating device provides a collimated light beam, such a collimating lens 406 may not be required.

In another embodiment, the light source 401 is arranged to provide a Bessel light beam. A Bessel light beam may be characterized in that in a spot of a Bessel light beam, the energy profile (e.g. intensity as function of the distance from the centre) may be described with a Bessel function instead of a Gaussian function. An advantage of a Bessel light beam is that the spot may be small, while the depth of focus is large.

The optical system 405 may further comprise a beam splitter 407, for directing the light beam 403 towards surface 12. The optical system 405 may comprise a focus lens 408 for focusing alignment light beam 403 on the surface 12. The reflected alignment light beam 409 is generated by reflection on the surface 12 of the alignment light beam 403. The focus lens 408 may also be used for collimating the reflected beam 409. The beam splitter may then direct reflected beam 409 towards the light intensity detector 410.

The light intensity detector 410 may comprise a photodiode or an un-biased silicon PIN diode working in the photovoltaic mode. This mode may lower the amount of heat generated with respect to a biased mode operation of a photodiode. The light intensity detector may also comprise an operational amplifier to convert the current from the photodiode into a voltage which may be filtered. The filtered voltage may be converted to a digital signal that may be used by a processing unit, for example the processing unit of the lithography system the alignment sensor is a part of.

The active area of the light intensity detector 410 may be larger than the diameter of the reflected alignment light beam 409 leaving the beam splitter 407. An other focus lens (not shown in FIG. 4) may positioned between the beam splitter 407 and light intensity detector 410 to focus the reflected alignment light beam on the active area, in order to use all the energy leaving the beam splitter 407.

In a non-polarizing beam splitter it may be the case that 50% of the alignment light beam 11 is directed towards the surface 12, while the other 50% may be lost. And of the reflected alignment light beam only 50% may be directed to the light intensity detector, while the other 50% may be lost. This implies that 75% of the alignment light beam 403 is lost, i.e. is not used for the position detection.

Therefore, a polarizing beam splitter 407 may be used in an embodiment of the alignment sensor. In that case, the light source may provide a polarized alignment light beam 403. The light source may comprise a polarizer 412 arranged for transforming a non-polarized light beam into a polarized light beam. Alignment light beam 403 may be an S-polarized light beam, which is indicated in FIG. 4 by a dot.

The polarizing beam splitter 407 may be arranged for guiding the S-polarized alignment light beam towards the surface. The optical system may further comprise a quarter wave plate 411, which may be located between the polarizing beam splitter 407 and the focus lens 408. When the alignment light beam 403 travels through the quarter wave plate 411, it may change its polarization from S-polarization into a right circular polarization, as is indicated by a curved arrow in FIG. 4. When the alignment light beam 403 is reflected by the surface 12, polarization may change again: the reflected alignment light beam 409 may have a left circular polarization, as is indicated by another curved arrow in FIG. 4. When the reflected alignment light beam 408 travels through the quarter wave plate 411, it may change its polarization from left circular polarization into a P-polarization which is indicated by a straight arrow in FIG. 4. Polarizing beam splitter 407 may be arranged to guide the P-polarized reflected alignment light beam towards the light intensity detector 410.

The use of a polarized alignment light beam, a polarized reflected alignment light beam and a polarizing beam splitter may result in a reduction of stray light, back reflection and energy loss in the beam splitter. Furthermore, the polarizing filter 412 may be arranged to minimize reflection of light back into the light source.

In an embodiment of the alignment sensor, the focus lens 408 is arranged to focus alignment light beam 403 on surface 12 in cooperation with a transparent plate 413, which may refract both the alignment light beam 403 and the reflected alignment light beam 409. The refraction depends on the material of the transparent plate 41.

A height measurement system may be provided to measure the distance h between the alignment sensor and the surface 12 and/or the tilt of the height measurement system or the alignment sensor with respect to the surface.

With information about the distance h between the alignment sensor and the surface and/or the tilt of the alignment sensor with respect to the surface, said distance h and/or the tilt may be adapted to obtain or maintain the desired distance and/or tilt.

In an embodiment, the actuator may be arranged for changing said distance h and/or said tilt. In a further embodiment, the processing unit may be arranged for receiving information about said distance and/or tilt from the height measurement system.

The height measurement system may be an optical height measurement system or a capacitive height measurement system. The capacitive height measurement system may be a differential capacitive height measurement system.

Figure 5:
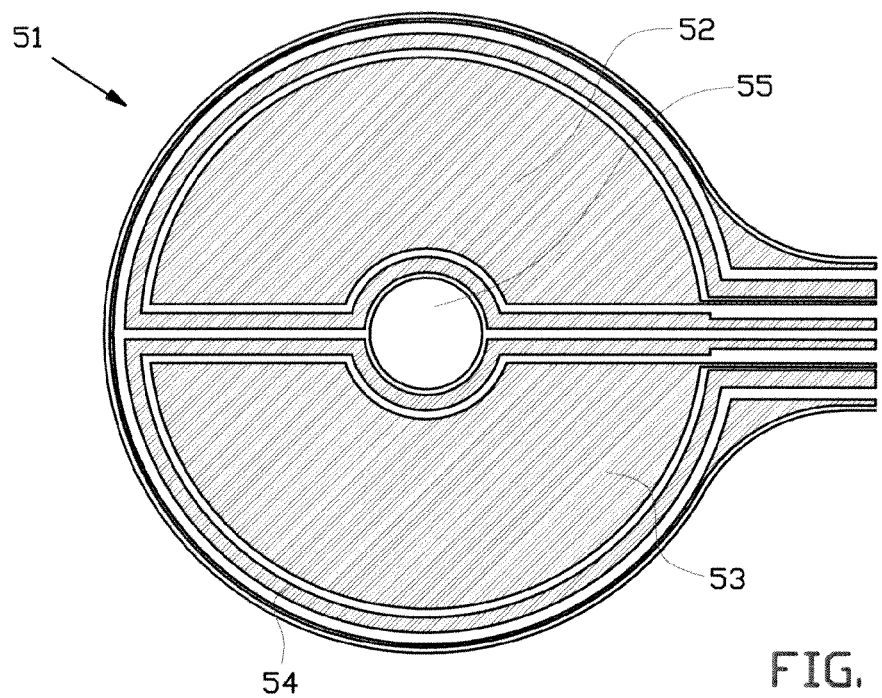
FIG. 5 schematically shows a view of an embodiment of a part of a differential capacitive height measurement system 51 according to an embodiment of the invention.

FIG. 5 shows schematically a view of an embodiment of a part of a differential capacitive height measurement system 51 according to an embodiment of the invention. The differential capacitive height measurement system may comprise a first measuring electrode 52, a second measuring electrode 53 and a guard 54, which are all electrically insulated with respect to each other.

The first measuring electrode 52, the second measuring electrode 53 and the guard 54 may comprise a thin layer comprising a metal such as copper. The first and the second measuring electrode may both have a half-moon like shape and may enclose together a circular opening 55.

The first measuring electrode 52, the second measuring electrode 53 and the guard 54 may be connected to a height measuring processing unit (not shown in FIG. 5) that may be arranged for determining the above-mentioned distance and/or tilt. The differential capacitive height measurement system may comprise such a processing unit. For the determining the above mentioned tilt, two pairs of measuring electrodes may be required, e.g. two structures as shown in FIG. 5.

The circular opening 55 may be arranged such that the alignment light beam and the reflected alignment light beam may pass through the circular opening 55 during the operation of the alignment sensor. Because of this arrangement of the differential capacitive height measurement system, the distance between the height measurement system and the surface may be measured at the location of the centre of the circular opening 55, thus at the location where the light beam and the reflected light beam may travel towards or from the surface, or at the location of the beam axis. Also the above-mentioned tilt may be measured at the location of the centre of the circular opening 55, using two pairs of measuring electrodes. These may be arranged one on top of the other and both may be arranged around the circular opening 55. An orientation of the first pair of measuring electrodes may be shifted with respect to an orientation of the second pair of measuring electrodes, for example by 90 degrees.

The differential capacitive height measurement system 51 of FIG. 5 may be arranged on the transparent plate 413 as is shown in FIG. 4, wherein the differential capacitive height measurement system is facing the surface. In this way, the distance between the differential capacitive height measurement system 51 and the focal plane of focus 12 (where the surface should be positioned) may be minimal, which may be an advantage since the performance of the differential capacitive height measurement system may decrease with the distance between the differential capacitive height measurement system and the object it is facing, in this case the surface 12.

In case the light source is arranged for providing a Bessel light beam, a height measurement system may not be required, since the relatively large depth of focus of such a beam allows for more inaccuracy in the distance between the alignment sensor and the surface.

In an embodiment, the mark position system comprises two alignment sensors, wherein each alignment sensor may be in accordance with embodiments of an alignment sensor described in this document. With two alignment sensors the position of a surface comprising two position marks may be easily determined in two dimensions, in an x-direction and a y-direction, or in a deflection direction and a scan direction.

The scan direction or axis may relate in electron beam lithography to the direction in which the target, such as a wafer, is being scanned during the patterning, while the deflection direction or axis may relate to the direction in which electron beam are being deflected during the patterning.

Figure 6:
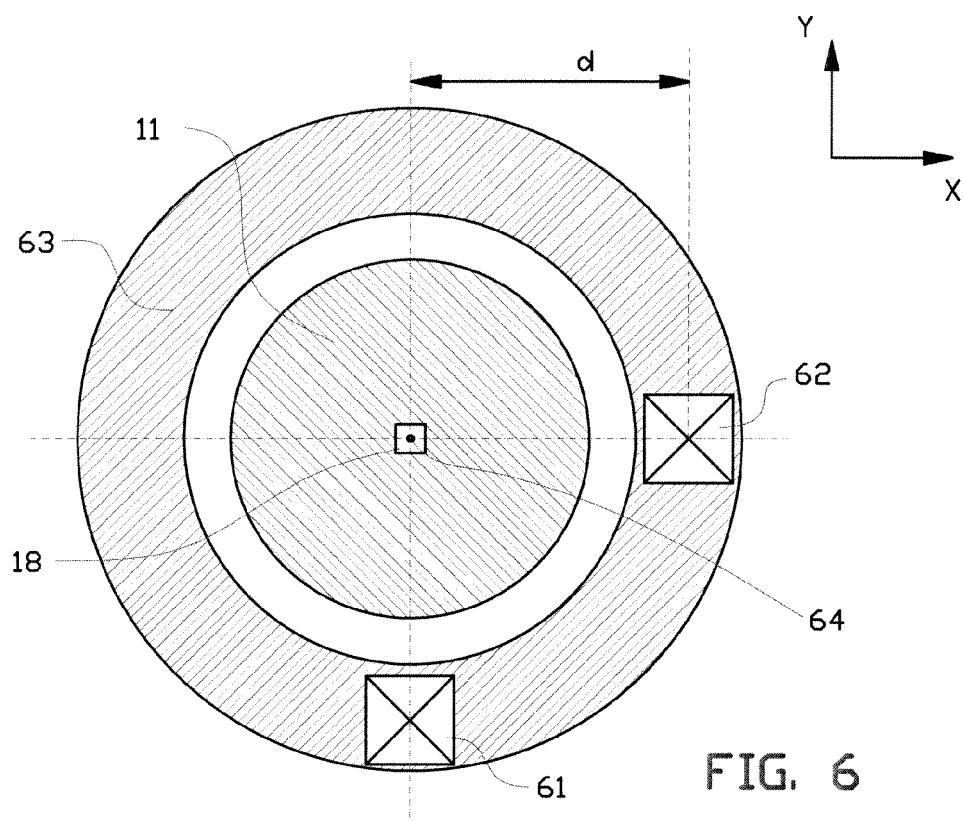
FIG. 6 schematically depicts a part of a cross-section of an embodiment of a lithography system, according to the invention.

FIG. 6 depicts a part of a cross-section of an embodiment of a lithography system, according to the invention. A first alignment sensor 61 may be arranged to detect the position of the surface in the y-direction and a second alignment sensor 62 may be arranged to detect the position of the surface in the x-direction. Beam 18 is depicted in the centre of FIG. 6. In the centre of the beam 18 the beam axis is indicated by a dot 64, while the beam axes of alignment sensors 61, 62 may be found at their respective centers. The above-mentioned distance d between the beam axis of the final projection system 11 and the beam axis of the alignment sensor 62 is indicated in FIG. 6. Also indicated in FIG. 6 is the support 63, which may have a ring-shape.

In FIG. 1, it is depicted how the support 63 may be connected to a frame 71 via three flexures 72 (only two flexures are shown in FIG. 1). The support 63 may be suspended from the frame 71. At least three flexures may be required to define the position of the ring in space. The flexures 72 may comprise a resilient material. The flexures 72 may be glued in recesses in the support 63, as may be seen in FIG. 1.

It may be understood from FIGS. 1 and 6, that if the final projection system would expand in a radial direction (i.e. perpendicular to the beam axis of the final projection system) due for example to temperature variations, the beam axis will remain at its position with respect to the surface 12. This expansion of the final projection system in radial direction may cause the support 63 to expand also in the radial direction. Because of the flexures, this would not cause an expansion force in the radial direction on frame 71. Likewise, any expansions of frame 71 in a radial direction would not cause an expansion force on the support 63 because of the flexures 72. Therefore, the frame 71 may comprise a high thermal expansion material, such as aluminium.

Figure 7:
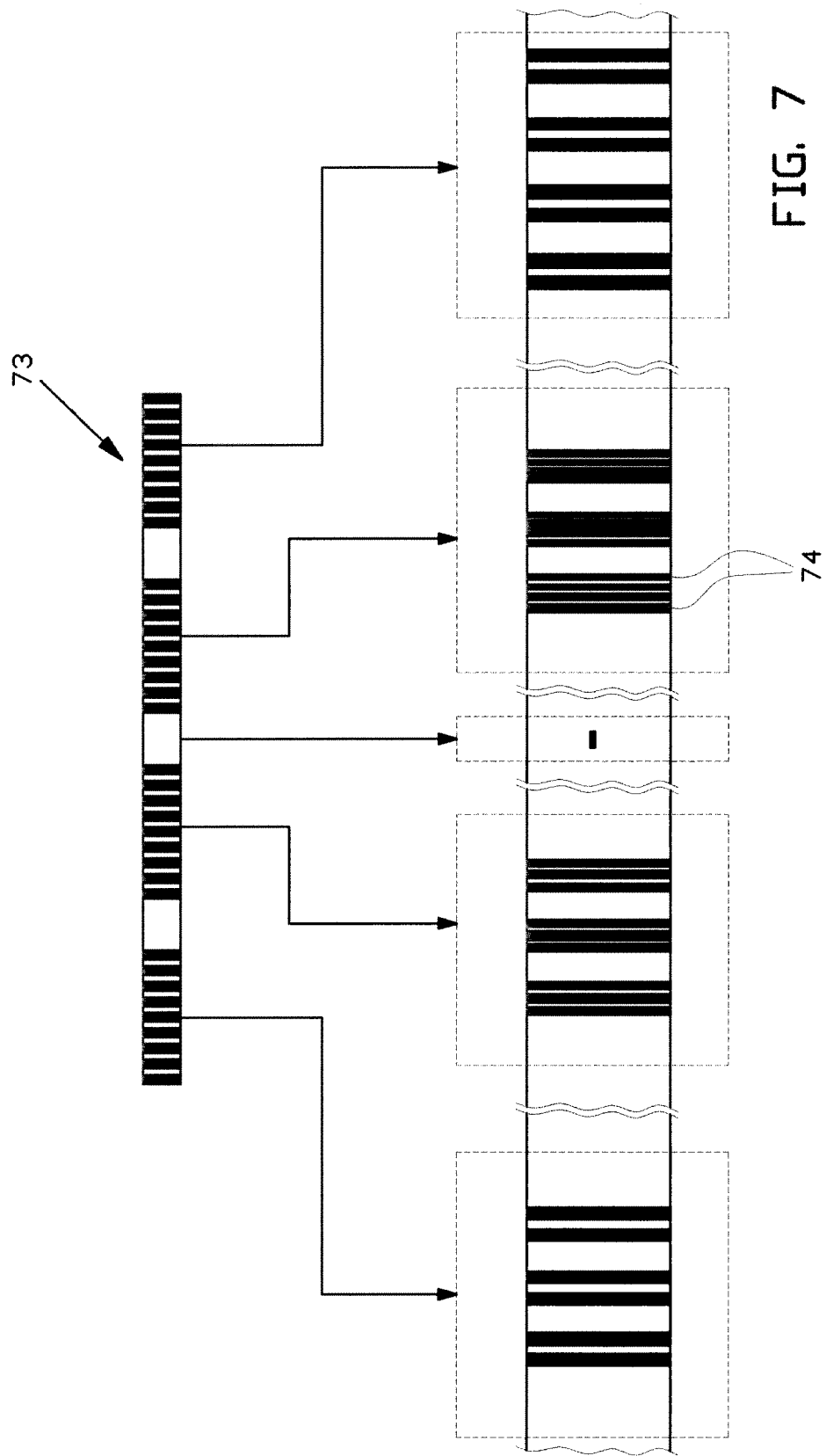
FIG. 7 shows a schematic overview of a position mark, such as a target position mark or a chuck position mark, according to an embodiment of the invention.

FIG. 7 shows a schematic overview of a position mark 73, such as a target position mark or a chuck position mark, according to an embodiment of the invention. The position mark 73 may comprises several areas 74, wherein a first reflective area has a higher reflection coefficient that a second reflective area, or vice versa.

FIG. 8 shows a schematic overview of a lithography system according to an embodiment of the invention. FIG. 8 provides an overview of a lithography system, which may comprise embodiments of elements of a lithography system as is described in this document.

The lithography system is preferably designed in a modular fashion to permit ease of maintenance. Major subsystems are preferably constructed in self-contained and removable modules, so that they can be removed from the lithography machine with as little disturbance to other subsystems as possible. This is particularly advantageous for a lithography machine enclosed in a vacuum chamber, where access to the machine is limited. Thus, a faulty subsystem can be removed and replaced quickly, without unnecessarily disconnecting or disturbing other systems.

In the embodiment shown in FIG. 8, these modular subsystems include an illumination optics module 801 which may comprise a beam source 802 and beam collimating system 803, an aperture array and condenser lens module 804 including aperture array 805 and condenser lens array 806, a beam switching module 807 including beamlet blanker array 808, and projection optics module 809 including beam stop array 810, beam deflector array 811, and projection lens arrays 812.

The above-mentioned final projection system may refer to the projection lens arrays 812.

The modules may be designed to slide in and out from an alignment frame. In the embodiment shown in FIG. 8, the alignment frame may comprise an alignment inner sub frame 813 and an alignment outer sub frame 814.

In the above flexures have been described for connecting the final projection system with a frame 71. In the FIG. 8, this connection and thus the flexures are not shown. However, the frame 71 may correspond to the alignment inner sub frame 813 or the alignment outer sub frame 814.

A main frame 815 may support the alignment subframes 813 and 814 via vibration damping mounts 816. The wafer or target rests on wafer table 817, which is in turn mounted on chuck 13. For clarity reasons, the wafer table 817 has not been mentioned in the above. Chuck 13 sits on the stage short stroke 818 and long stroke 819. To both the stage short stroke 818 and long stroke 819 is referred to as an actuator system in the above.

The lithography machine may be enclosed in vacuum chamber 820, which may include a mu metal shielding layer or layers 821. The system may rests on base plate 822 and may be supported by frame members 823.

Each module may require a large number of electrical signals and/or optical signals, and electrical power for its operation. The modules inside the vacuum chamber may these signals from a processor unit 824 which is typically located outside of the chamber.

The patterning beam may be collimated by collimator lens system 803. The collimated beam impinges on an aperture array 805, which blocks part of the beam to create a plurality of beamlets, for example at least two beamlets. However, the lithography system may be arranged for generating a large number of beamlets, preferably about 10,000 to 1,000,000 beamlets.

The beamlets may pass through a condenser lens array 806 which may focus the beamlets in the plane of a beam blanker array 808, comprising a plurality of blankers for deflecting one or more of the beamlets.

The deflected and undeflected beamlets may arrive at beam stop array 810, which may have a plurality of apertures. The beamlet blanker array 808 and beam stop array 810 may operate together to block or let pass the beamlets. If beamlet blanker array 808 deflects a beamlet, it will not pass through the corresponding aperture in beam stop array 810, but instead will be blocked. But if beamlet blanker array 808 does not deflect a beamlet, then it will pass through the corresponding aperture in beam stop array 810, and through beam deflector array 811 and projection lens arrays 812. The beam deflector array 811 may provide for deflection of each beamlet in the x and/or y direction, substantially perpendicular to the direction of the undeflected beamlets, to scan the beamlets across the surface of the target.

The beamlets may pass through projection lens arrays 812 and may be projected onto the target. The projection lens arrays 812 preferably provides a demagnification in the order of 25 to 500 times (depending of the specific electron-optical lay out). The beamlets may impinge on the surface of target positioned on moveable chuck 13 for carrying the target. For lithography applications, the target usually is a wafer provided with a charged-particle sensitive layer or resist layer.

The lithography system may operate in a vacuum environment. A vacuum may be desired to remove particles which may be ionized by the beams and become attracted to the source, may dissociate and be deposited onto the machine components, and may disperse the beams. In order to maintain the vacuum environment, the lithography system may be located in a vacuum chamber. All of the major elements of the lithography system are preferably housed in a common vacuum chamber, including the beam source, the optical column and the moveable chuck.

Figure 9:
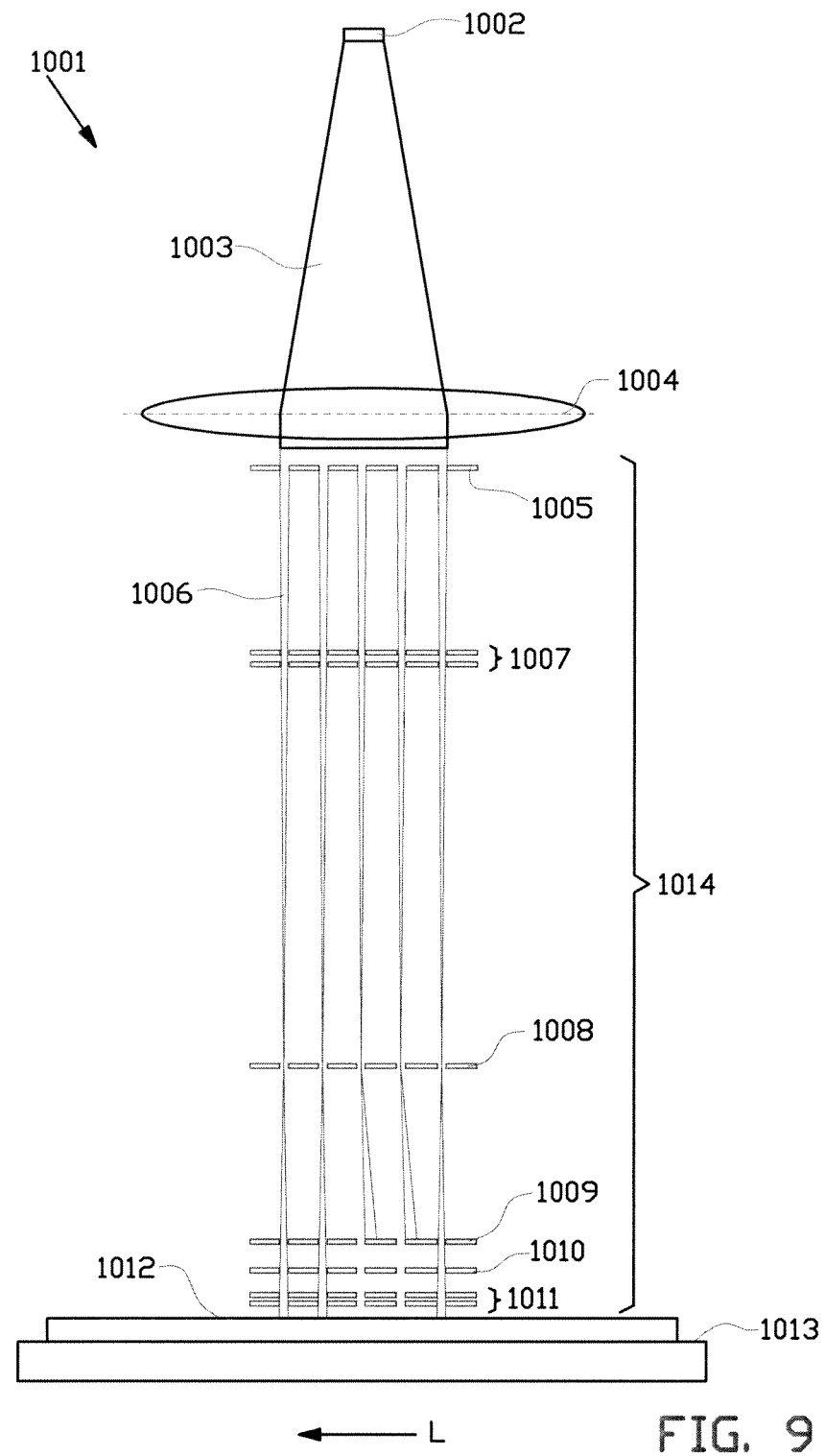
FIG. 9 shows a prior art lithography system in which the substrate according to the invention may be used.

A known lithography system is shown in FIG. 9. The lithography system 1001 comprises a charged particle beam source 1002 which emits a charged particle beam 1003. Charged particle beam 1003 traverses a collimator 1004 before impinging on an aperture array 1005. The aperture array splits the beam into a multitude of charged particle beamlets 1006 which are condensed by condenser array 1007. At beam blanker array 1008 individual beamlets may be blanked, i.e. may be individually deflected such that they encounter beam stop array 1009 later on in their trajectories instead of passing through apertures in beam stop array 1009. The beamlets that have not been blanked then pass through a scanning deflector 1010 which is adapted to provide a scanning deflection of said beamlets. At the end of their trajectories the beamlets that have not been blanked pass through a focusing lens array 1011 adapted for focusing said beamlets onto a surface of a target 1012, for instance a wafer. The target is placed on a moveable target carrier 1013, adapted for displacing the target relative to optical column 1014 along a long-stroke direction L, using a long-stroke actuator. The target carrier is further adapted for displacing the target along a short-stroke direction S by means of a short-stroke actuator. The short-stroke actuator may further comprise a 6 degree of freedom actuator, for fine tuning translation of the target in three orthogonal directions, and for fine tuning rotation of the target along three orthogonal axes. Typically a target 1012 is exposed in a strip-by-strip fashion by moving the target under the optical column 1014 using the long stroke actuator while exposing the target 1012 to beamlets that may be deflected along the width of a strip along the short-stroke direction by the scanning deflector 1010. When an entire strip has thus been patterned, the short stroke actuator may be used to displace target a distance corresponding to the width of the strip in the S direction, and the next strip may be processed.

When structures span more than one strip, or when a strip of the target is to be processed in multiple passes, for instance when patterning different layers of a semiconductor device, it is essential that the overlain layers can be aligned to within a specified accuracy. Such alignment may be achieved by accurately positioning the target 1012 relative to the optical column 1014.

FIG. 10 shows a schematic top view of a prior art position measurement system for use in a lithography system, in which the position of the optical column 1014 is measured relative to a target carrier 1013 carrying a target 1012. The target 1012 is partitioned into strips along the long-stroke direction L. Patterning of the target may commence when point p1 of the target is placed under the optical column 1014 of a lithography system. Because of the scanning deflection of the beamlets, any part of the strip can be reached by the beamlets when the target 1012 is moved under the optical column 1014 by the long-stroke actuator of the lithography system. When point P2 of the target 1012 is under the optical column 1014, the short-stroke actuator may be used to move the target in a direction perpendicular to the long-stroke direction L, such that point P3 of the target is placed directly underneath the optical column 1014, and the next strip may be processed. Target carrier 1013 is provided with straight edges 1015, 1016, or mirrors, wherein edge 1015 is perpendicular to the long-stroke direction L, and edge 1016 is perpendicular to short-stroke direction S. The edges 1015, 1016 are adapted reflecting one or more beams 1021a, 1021b, 1023a, 1023b respectively from interferometers 1020, 1022 for keeping track of a change in distance between said interferometer and edge 1015 and 1016 respectively of the target carrier 1013. Based on any changes in these distances a position of the target 1012 relative to the optical column 1015 is calculated, i.e. the position is obtained indirectly as a function of change in the distance along the long- or short-stroke directions. Any changes in said distance will lead to a change in the calculated position, even if the changes in distance are not caused by a long-stroke or short-stroke actuator of the system. For instance, when the edge 1015 deforms, changing the tilt of the edge and/or changing the focus of interferometer beam 1021a incident on the edge 1015, the calculated position of the target 1012 relative to the optical column 1014 will change. Moreover, any changes in the position or orientation of the interferometer 1020 will affect the calculated position as well.

FIG. 11A shows an embodiment of a substrate 1045 according to the invention. The substrate 1045 comprises an at least partially reflective surface 1040 adapted for at least partially reflecting a beam, such as a beam having a Gaussian beam profile. In the embodiment shown the surface 1040 comprises silicon oxide or silicon dioxide, preferably coated with a reflective metal, and is provided with beam absorbing structures 1041a, 1041b, 1042a, 1042b, 1043a, 1043b, and 1044a, 1044b, which are adapted for at least partially absorbing a beam having a wavelength λ, for example 640 nm. The structures 1041a, 1041b, 1042a, 1042b, 1043a, 1043b, and 1044a, 1044b together with the surface 1040 form a position mark extending along its longitudinal direction L. Preferably the substrate is arranged in a lithography system, for instance a system as shown in FIG. 9, with its longitudinal direction L along the long-stroke direction of the lithography system. The substantially rectangular structures 1041a, 1041b, 1042a, 1042b, 1043a, 1043b, and 1044a, 1044b are spaced apart and arranged to vary a reflection intensity of the beam dependent on the position of beam spot 1050 of the beam on the surface. The distance between any two structures is less than the wavelength λ, and less than or equal to the width w of the beam spot which is defined as the maximum dimension of the beam spot along direction L. Thus, at any time the beam spot is within the pattern, it is located either directly adjacent to or incident on one or more of the structures. The pattern of the structures repeats over a period D which period is greater than the width w of the beam spot 1050. In this embodiment the distance between neighboring structures is related to the amount of light the structures can absorb when the alignment beam is incident thereon. The structures having larger areas 1041a, 1041b and 1042a, 1042b are arranged closer to each other than structures 1043a, 1043b and 1044a, 1044b which have smaller areas with which to absorb the beam. Moreover the pitch between two structures, e.g. the distance from a leftmost side of a first structure to a leftmost side of a second, neighboring structure, varies dependent on the areas of the structures.

FIG. 11B shows a reflected beam intensity graph for the substrate of FIG. 11A. The intensity I of the reflected beam is highest when no part of the beam 1050 spot is incident on a structure, as at point 1061 along the longitudinal axis, and lowest when the beam spot is at point 1062 along the longitudinal axis L, at which point a substantial part of the beam is absorbed by the structures 1041a, 1041b, and 1042a, 1042b. When the position mark is illuminated by a beam with a substantially constant intensity and the beam spot travels along direction L, the intensity of the reflected beam follows a sinusoid function as shown, even when the beam spot has a Gaussian profile. The reflected signal thus provides a reference for a position of the beam spot within a period of the pattern.

Information on the position of the beam spot on the substrate is encoded at the substrate in the form of the intensity of the reflected light beam. Small deformations of the surface or changes in distance between the alignment beam source and the surface do not substantially change the intensity of the reflected beam and therefore do not substantially affect the position measurement. Moreover, requirements on the position and focus and/or position stability of the beam source can be relatively lax as small changes in focus depth or angle of incidence do not substantially influence the shape of the resulting intensity graph.

FIGS. 12A, 12B and 12C show embodiments of a substrate according to the invention. FIG. 12A shows structures 1071a, 1071b, 1072a, 1072b, 1073a, 1073b, 1074a, 1074b, 1075a, and 1075b of a same width b, etched on a partially reflective surface 1070 of a substrate 1090 comprising polished silicon oxide. The width b of the structures is smaller than the wavelength of a beam which is to illuminate the substrate 1090 for positioning purposes. The structures 1071a, 1071b, 1072a, 1072b, 1073a, 1073b, 1074a, 1074b, 1075a, and 1075b repeat over a period a, which is larger than the diameter w1 of the spot 1095 of the beam on the substrate 1090. When the beam has a Gaussian beam profile, the diameter of the beam is determined w1 in a manner known in the art, for instance by determining the full width of the beam at half its maximum intensity. A distance c between two leftmost edges of neighboring structures varies along the longitudinal direction L of the substrate 1090, such that the intensity of the beam reflected by the substrate varies along the longitudinal direction L. The maximum distance between two neighboring structures is equal to the diameter w1 of the beam spot 1095. In an embodiment this maximum distance may be less than the diameter w1 as well.

FIG. 12B shows a substrate 1091 according to the invention in which the leftmost edges of structures 1076a, 1077a, 1078a, 1079a are aligned on a virtual grid of points which are arranged equidistantly at a distance from each other along the longitudinal direction. The structures form a periodic pattern having a period a, and each have a width. The width of the structures varies sinusoidally along the longitudinal direction L. Within a period of the pattern, a distance between two leftmost edges of two neighboring structures 1077a, 1078a is different from a distance between two leftmost edges of two other neighboring structures 1079a, 1079b, i.e. the distance is c and 3 times c respectively. Thus, when the beam spot 1096 having a diameter w2 greater than c is incident on the substrate but not on structures of the substrate, as shown, the reflected beam will have a maximum reflected intensity. The substrate according to this embodiment is especially easily manufactured, as the structures are aligned on a regular grid.

In FIG. 12C the distance from leftmost edge to leftmost edge between neighboring structures varies along the longitudinal direction L of substrate 1092, and the width b of the structures 1080a, 1080b, 1081a, 1081b, 1082a, 1082b, 1083a, 1083b themselves varies along the longitudinal direction L as well. No two neighboring structures are spaced apart more than the diameter w3 of the beam spot 1097.

FIG. 12D shows an embodiment of a substrate 1093 according to the present invention, comprising a partially reflective surface 1070, on which structures 1084a, 1084b, 1085a, 1085b, 1086a, 1086b, 1087a, 1087b and 1088a, 1088b are provided in a periodic array having period a. Within a period pairs of structures 1084a, 1084b, ... 1088a, 1088b of a same material are provided. The structures 1084a, 1085a, 1086a, 1087a and 1088a all comprise different materials having different reflection coefficients. The pitch c between the structures is equal along the longitudinal direction, and the structures have a substantially equal width along the longitudinal direction as well. The intensity of the reflected beam depends on the position of the beam spot 1098 on the substrate.

Figure 13:
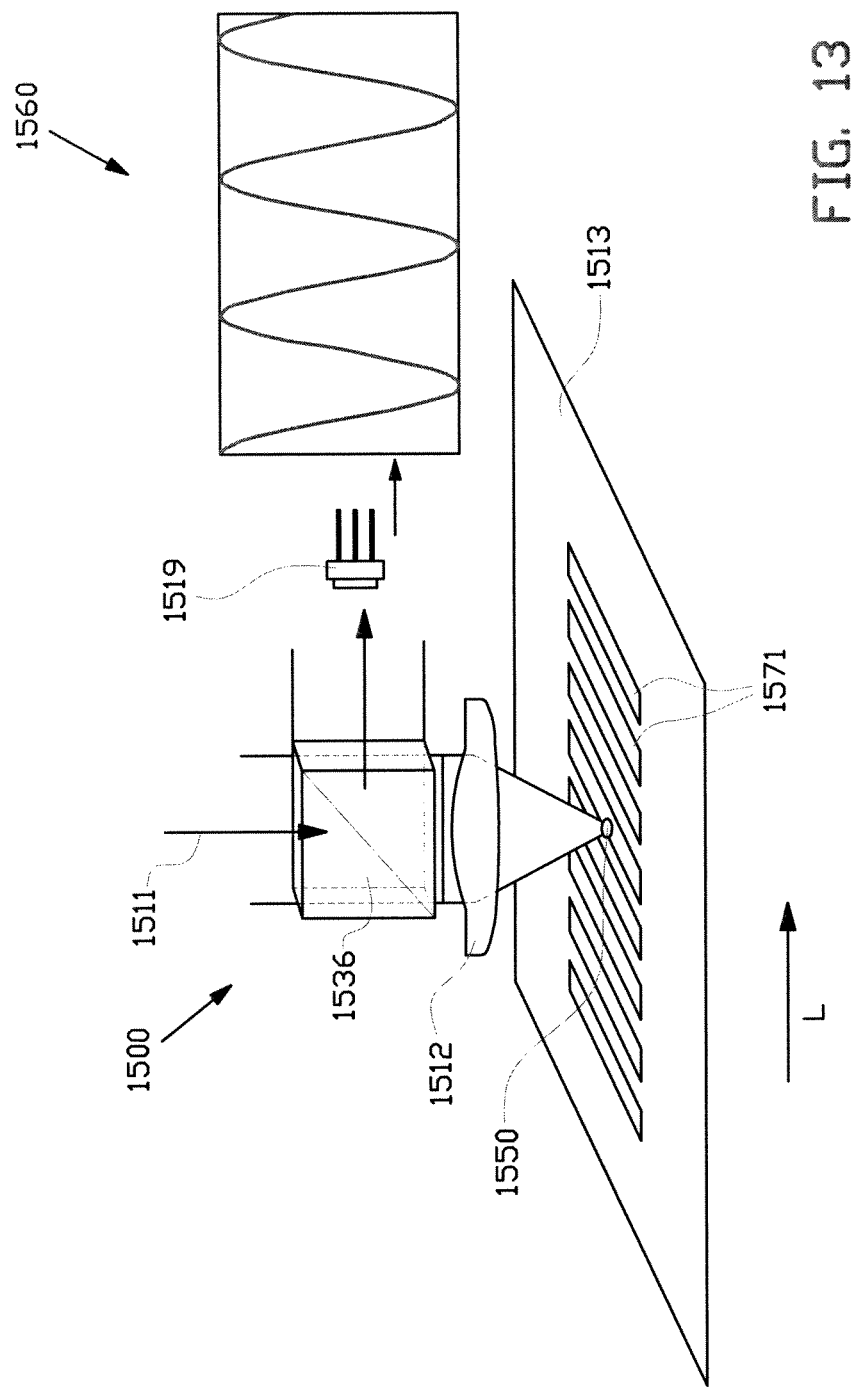

FIG. 13 schematically shows a position device 1500 according to the invention, for detecting an alignment and/or position of a beam spot 1550 on a substrate 1513 according to the invention. The substrate comprises a partially reflective surface, said surface having a substantially constant reflection coefficient, and provided with beam absorbing structures 1571, which vary a specular reflection coefficient of the substrate along the longitudinal direction L. A light beam 1511 of a predetermined wavelength is passes through beam splitter

1536 and is focused by lens 1512 onto a spot on the substrate 1513, and partially reflected therein. The intensity of the reflected beam is detected by beam intensity detector 1519. Graph 1560 shows a plot of the detected beam intensity vs. position of the spot on the substrate, when the substrate is moved along the longitudinal, or long-stroke, direction L. The position device is adapted for alignment of a beam spot on a substrate according to the invention, for instance by moving the substrate along the direction L relative to the position device, until a specific peak in detected light intensity has been reached. Using a target comprising a substrate according the invention it is thus possible to reproducibly and accurately move the substrate to a predetermined position with respect to the alignment beam. This is particularly useful when several layers of patterns are overlain during separate processing sessions of a same target. Once the target has been aligned the position may be tracked using other position measuring means known in the art, such as interferometers.

Alternatively, the position device may be used to track a position of the beam on the substrate during processing of the target, e.g. during preparation and/or exposure of a target in a lithography system, based on the number of peaks encountered in the detected intensity signal. Based on the number of peaks encountered and the actual detected intensity value, an even more accurate position can be determined.

It may be understood that, according to an aspect of the invention, a lithography system may be provided according to one of the embodiments described above, wherein said target comprises a substrate as described above. In this, the target position mark and/or the chuck position mark may be identical to the at least partially reflective position mark as described in this document.

Some embodiments of the invention may also be described by the following clauses:

1] Substrate for use in a lithography system, said substrate being provided with an at least partially reflective position mark comprising an array of structures, the array extending along a longitudinal direction of the mark, wherein said structures are arranged for varying a reflection coefficient of the mark along the longitudinal direction, wherein said reflection coefficient is determined for a predetermined wavelength, characterized in that a pitch between a first structure of the array and a second structure of the array neighboring said first structure is different from a pitch between said second structure and a third structure of the array neighboring said second structure, and wherein the pitch between neighboring structures along the longitudinal direction follows a sinusoid function of the position of said structures along the longitudinal direction.

2] Substrate according to clause 1, wherein said structures are arranged for varying a specular reflection coefficient of the mark along the longitudinal direction, and.

3] Substrate according to clause 2, wherein said structures are adapted for substantially absorbing higher order diffractions by multiple reflection of said higher order diffractions within the mark.

4] Substrate according to any one of the preceding clauses, wherein said structures each have a width along the longitudinal direction, said width being less than said predetermined wavelength, and wherein a distance between neighboring structures along the longitudinal direction is less than said predetermined wavelength.

5] Substrate according to any one of the preceding clauses, wherein said substrate comprises a wafer.

6] Substrate according to any one of the preceding clauses, wherein the structures are aligned on points which are equidistantly spaced along the longitudinal direction.

7] Substrate according to clause 4, wherein a first structure of said structures has a different width along the longitudinal direction than a second structure of said structures.

8] Substrate according to any one of the clauses 1-6, wherein said structures have substantially identical dimensions, said structures preferably having rectangular shapes.

9] Substrate according to clause 8, wherein the distance between neighboring structures along the longitudinal direction of the mark is substantially equal to a width of a structure.

10] Substrate according to clause 9, wherein a maximum distance between neighboring structures along the longitudinal direction is at most 610 nm, preferably within a range of 590 nm to 610 nm, preferably substantially equal to 600 nm.

11] Substrate according to any one of the preceding clauses, adapted for cooperation with a positioning system which is adapted for emitting a light beam onto the substrate for generating a beam spot on said substrate, wherein the light beam has a wavelength equal to the predetermined wavelength, wherein a maximum distance between neighboring structures along the longitudinal direction is at most equal to the diameter of the beam spot.

12] Substrate according to clause 11, wherein said light beam has a substantially Gaussian profile.

13] Substrate according to any one of the preceding clauses, wherein said structures form a periodic pattern of structures repeating along said longitudinal direction, and wherein the period of said pattern is larger than said diameter of the beam spot, preferably at least twice as large.

14] Substrate according to clause 13, wherein the periodic pattern of structures has a period of 2 micron.

15] Substrate according to any one of the clauses 11-14, wherein the pitch between neighboring structures is less than or equal to diameter of the beam spot.

16] Substrate according to clause any one of the clauses 11-15, wherein the structures are dimensioned and arranged for varying the reflection coefficient as a sinusoidal function of the position of beam spot on the position mark along the longitudinal direction.

17] Substrate according to any one of the preceding clauses, wherein said substrate is formed as an integrated unit from a single material.

18] Substrate according to any one of the clauses 1-16, wherein a first of said structures comprises a first material and a second of said structures comprises a second material having a different reflection coefficient than said first material.

19] Substrate according to any one of the preceding clauses, wherein a maximum reflection coefficient of an area of the position mark for said wavelength is substantially equal to 1.

20] Position device arranged for determining a position of a beam on a position mark of a substrate according to any one of the clauses 1-19, said position device comprising:

a beam source arranged for providing a light beam of said predetermined wavelength;

a beam intensity detector arranged for determining an intensity of a reflected light beam, wherein the reflected light beam is generated by reflection of the light beam on said position mark;

an optical system arranged for focusing the light beam on the position mark and for guiding the reflected light beam on the beam intensity detector, wherein said beam intensity detector is arranged for detecting a light beam intensity for the zeroth order reflection of the reflected light beam and adapted for providing a signal representative of the reflected beam intensity.

21] Lithography system for processing a target, said system comprising a substrate according to any one of the clauses 1-19, said system comprising:

an alignment beam source arranged for providing an alignment beam of said predetermined wavelength;

a alignment beam intensity detector arranged for determining an intensity of a reflected alignment beam, wherein said reflected alignment beam is generated by reflection of the beam on said position mark;

an optical system arranged for focusing the alignment beam on the position mark and for guiding the reflected alignment beam on the alignment beam intensity detector, wherein said alignment beam intensity detector is arranged for detecting an alignment beam intensity of the zeroth order reflection of the reflected alignment beam.

22] Lithography system according to clause 21, further comprising:

a target carrier, adapted for moving the target relative to the optical system along the longitudinal direction, wherein said substrate is provided on the target carrier and/or on the target, a processing unit adapted for determining an alignment and/or position of the substrate relative to the optical system based on the detected intensity of the reflected alignment beam.

23] Lithography system according to clause 22, further comprising an optical column adapted for projecting one or more exposure beams on the target, wherein the optical system is attached to the optical column.

24] Lithography system according to clause 23, wherein the optical column is adapted for projecting a multitude of charged particle exposure beams through the onto the target, and wherein said optical system is mounted on or near a downstream portion of the optical column, preferably within a distance of 100 micron to an outer exposure beam thereof.

25] Lithography system according to any one of the clauses 21-24, wherein, at least during use the optical system is arranged at a distance of 2 mm or less from the substrate.

26] Lithography system according to any one of the clauses 21-25, wherein the optical system is arranged for projecting said alignment beam onto the substrate substantially perpendicular on said substrate.

27] Method for manufacturing an alignment and/or positioning mark on a substantially reflective substrate to be illuminated by a beam, comprising a step of:

providing said structures on the substrate, each structure arranged within a distance of a beam wavelength from a neighboring structure, said structures adapted to substantially absorb the energy of said incident beam.

28] Method according to clause 27, wherein said structures are provided on the substrate at different distances and/or pitches from each other.

29] Method according to clause 27 or 28, wherein said structures form a pattern with a period greater than a diameter of a beam spot of said beam.

30] Method for alignment and/or position determination of a beam spot on a substrate according to any one of the clauses 1-19, said method comprising:

illuminating the substrate with a light beam, detecting an intensity of a specular reflection of said light beam, determining, based on said detected intensity, a position and/or alignment of substrate relative to the beam spot.

31] Method according to clause 30, further comprising a step of measuring a position of the substrate using a further measurement system, wherein the position and/or alignment of the substrate is further determined based on the measurement by the further measurement system.

It may be understood that the described embodiment of a lithography system using an electron beam to pattern a target may also be applied to a lithography system using a light beam to pattern a target, mutatis mutandis.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. Lithography system for processing a target, the target (12; 1012) comprising a target surface with a target position mark (24;73) provided thereon, the lithography system comprising:

a beam source (802; 1002) arranged for providing a patterning beam;

a final projection system (11; 812; 1011) arranged for projecting a pattern on the target surface with said patterning beam, a chuck arranged (13) for supporting the target;

an actuator system (818,819) arranged for moving the chuck in at least one dimension with respect to the final projection system; and, a mark position system (17) arranged for detecting a position mark on a surface, wherein the mark position system comprises at least one alignment sensor (61,62), the at least one alignment sensor comprising:

a light source (410) arranged for providing an alignment light beam (403);

a light intensity detector arranged for determining a light intensity of a reflected alignment light beam (409), wherein the reflected alignment light beam is generated by reflection of the alignment light beam on said surface; and, an optical system (405) arranged for focusing the alignment light beam on the surface and for guiding the reflected alignment light beam on the light intensity detector, a differential capacitive height measurement system (51) for measuring a distance between the alignment sensor and the surface and comprising a first measuring electrode (52) and a second measuring electrode (53), wherein said differential capacitive height measurement system (51) is provided with an opening (55) arranged for allowing the alignment light beam and the reflected alignment light beam to pass through said opening (55), and wherein the first and second measuring electrode enclose said opening.

2. Lithography system according to claim 1, wherein the light source comprises a laser arranged for generating the alignment light beam and an optical fiber for guiding the alignment light beam from the laser to the optical system.

3. Lithography system according to claim 1 or claim 2, wherein the optical system comprises a beam splitter arranged for guiding at least a part of the alignment light beam towards the surface and for guiding at least a part of the reflected alignment light beam towards the light intensity detector.

4. Lithography system according to claim 3, wherein the optical system further comprises a diaphragm positioned between the beam splitter and the light intensity detector.

5. Lithography system according to claim 3, wherein:
the light source is arranged for providing a polarized alignment light beam;
the beam splitter is a polarizing beam splitter, arranged for guiding the polarized alignment light beam towards the surface;
the optical system further comprises a quarter wave plate, which is located in a light path of both the alignment light beam and the reflected alignment light beam between the polarizing beam splitter and the surface; and,
the beam splitter is further arranged for guiding a polarized reflected alignment light beam towards the light intensity detector.

6. Lithography system according to claim 1, wherein the light source comprises a collimator lens for collimating the alignment light beam from the light source.

7. Lithography system according to claim 1, wherein, the optical system comprises a focus lens for focusing said alignment beam on the surface and further comprises another focus lens arranged for focusing the reflected alignment light beam on the light intensity detector.

8. Lithography system according to claim 1, wherein said first measurement electrode and said second measuring electrode form a first pair of measuring electrodes, said alignment sensor further comprising a second pair of measuring electrodes, and wherein the height measurement system is further arranged for measuring a tilt of the alignment sensor with respect to the surface using said first and second pairs of measuring electrodes.

9. Lithography system according to claim 1, wherein the optical system comprises a focus lens for focusing said alignment beam on the surface and further comprises a transparent plate positioned between the focus lens and the surface, and wherein the height measurement system is arranged on the transparent plate, wherein the height measurement system is facing the surface.

10. Lithography system according to claim 1, wherein said first and second measuring electrodes each have a half-moon-like shape and are arranged to enclose said circular opening.

11. Lithography system according to claim 1, wherein an incident angle defined by the alignment light beam and the surface is equal to 90 degrees.

12. Lithography system according to claim 1, further comprising said target.

13. Lithography system according to claim 1, wherein the position mark comprises at least one trench.

14. Lithography system according to claim 13, wherein the light source is arranged for providing an alignment light beam with a predetermined wavelength and the at least one trench has a depth, wherein the depth is substantially equal to a quarter of said predetermined wavelength.

15. Lithography system according to claim 1, wherein the position mark comprises at least a first and a second reflective area, wherein the first reflective area has a higher reflection coefficient than the second reflective area.

16. Lithography system according to claim 15, wherein the light source is arranged for providing an alignment light beam with a wavelength and at least one of the first and second reflective area comprises structures with dimensions smaller than said wavelength.

17. Lithography system according to claim 1, wherein the position mark comprises an NVSM-X mark.

18. Lithography system according to claim 1, wherein the mark position system (17) is connected to the final projection system via a support (63) which supports both the final projection system (11) and the mark position system (17).

19. Lithography system according to claim 18, wherein a distance between a beam axis of the mark position system and a beam axis of the final projection system is in the range of 10-100 mm.

20. Lithography system according to claim 18, further comprising a frame and at least three flexures, wherein the support is suspended from the frame with the at least three flexures.

21. Lithography system according to claim 1, wherein the light intensity detector is arranged for providing light intensity information based on a detected light intensity and the mark position system further comprises a processing unit, the processing unit being arranged for:
controlling the actuator;
receiving the light intensity information; and,
detecting a position of the position mark.

22. Lithography system according to claim 1, wherein said alignment sensor further comprises a guard (54) surrounding said first and second measuring electrodes, wherein said guard and said first and second measuring electrodes (52,53) are electrically insulated with respect to each other, said guard and said first and second measuring electrodes each comprising a thin layer comprising a metal.

23. Alignment sensor (61; 62) comprising:
a light source (401) for providing an alignment light beam (403);
an optical system (405) arranged for focusing the alignment light beam on the surface, wherein a reflected alignment light beam is generated by reflection of the alignment light beam on said surface;
a light intensity detector (410) arranged for determining a light intensity of said reflected alignment light beam;
wherein said optical system (405) is further arranged for guiding the reflected alignment light beam on the light intensity detector,
said alignment sensor further comprising:
a differential capacitive height measurement system (51) for measuring a distance between the alignment sensor and the surface and comprising a first measuring electrode (52) and a second measuring electrode (53),
wherein said differential capacitive height measurement system (51) is provided with an opening (55) arranged for allowing the alignment light beam and the reflected alignment light beam to pass through said opening, and wherein the first and second measuring electrode enclose said opening.

24. Alignment sensor according to claim 23, wherein the optical system comprises a beam splitter arranged for guiding at least a part of the alignment light beam towards the surface and for guiding at least a part of the reflected alignment light beam towards the light intensity detector.

25. Alignment sensor according to claim 24, wherein:
the light source is arranged for providing a polarized alignment light beam;
the beam splitter is a polarizing beam splitter, arranged for guiding the polarized alignment light beam towards the surface;
the optical system further comprises a quarter wave plate, which is located in a light path of both the alignment light beam and the reflected alignment light beam between the polarizing beam splitter and the surface; and, the beam splitter is further arranged for guiding a polarized reflected alignment light beam towards the light intensity detector.

26. Alignment sensor according to claim 23, wherein said first measurement electrode and said second measuring electrode form a first pair of measuring electrodes, said alignment sensor further comprising a second pair of measuring electrodes, and wherein the height measurement system is further arranged for measuring a tilt of the alignment sensor system with respect to the surface using said first and second pairs of measuring electrodes.

27. Alignment sensor according to claim 23, wherein said first and second measuring electrodes each have a half-moon-like shape and arranged to enclose a circular opening.

28. Alignment sensor according to claim 23, wherein said alignment sensor further comprises a guard (54) surrounding said first and second measuring electrodes, wherein said guard and said first and second measuring electrodes (52,53) are electrically insulated with respect to each other, said guard and said first and second measuring electrodes each comprising a thin layer comprising a metal.

29. Method for operating a lithography system for processing a target, said lithography system comprising an alignment sensor according to claim 23, said target comprising a target surface with a target position mark provided thereon, the method comprising:
  using said height measurement system, measuring a distance between the alignment sensor and said surface,
  based on said measured distance, controlling the distance between the surface and the alignment sensor for focusing said alignment light beam on the surface;
  guiding the reflected alignment light beam on said light intensity detector;
  moving said surface;
  detecting the position of the position mark based on a light intensity of said reflected alignment beam detected by said light intensity detector.

* * * * *